(12) United States Patent
Lii et al.

(10) Patent No.: US 9,437,449 B2
(45) Date of Patent: Sep. 6, 2016

(54) UNIFORM, DAMAGE FREE NITRIDE ETCH

(71) Applicant: Texas Instruments Incorporated, Dallas, TX (US)

(72) Inventors: Tom Lii, Plano, TX (US); David Farber, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 326 days.

(21) Appl. No.: 14/142,075

(22) Filed: Dec. 27, 2013

(65) Prior Publication Data

US 2014/0187009 A1   Jul. 3, 2014

Related U.S. Application Data

(60) Provisional application No. 61/747,680, filed on Dec. 31, 2012.

(51) Int. Cl.
| | |
|---|---|
| *H01L 21/311* | (2006.01) |
| *H01L 21/336* | (2006.01) |
| *H01L 21/8238* | (2006.01) |
| *H01L 29/66* | (2006.01) |
| *H01L 29/78* | (2006.01) |
| *H01J 37/32* | (2006.01) |

(52) U.S. Cl.
CPC .... *H01L 21/31116* (2013.01); *H01L 21/31144* (2013.01); *H01L 21/823807* (2013.01); *H01L 21/823828* (2013.01); *H01L 21/823864* (2013.01); *H01L 29/66575* (2013.01); *H01L 29/66636* (2013.01); *H01L 29/78* (2013.01); *H01L 29/7843* (2013.01); *H01J 37/32357* (2013.01)

(58) Field of Classification Search
CPC ........... H01L 21/31116; H01L 21/31144; H01L 37/32357; H01L 21/823828; H01L 21/823864

See application file for complete search history.

(56) References Cited

U.S. PATENT DOCUMENTS

| | | | | |
|---|---|---|---|---|
| 5,176,790 | A * | 1/1993 | Arleo | H01L 21/76802 252/79.1 |
| 5,814,563 | A * | 9/1998 | Ding | H01L 21/31116 257/E21.252 |
| 5,922,622 | A * | 7/1999 | Lee | H01L 21/31116 257/E21.252 |
| 6,069,091 | A * | 5/2000 | Chang | H01L 21/3065 257/E21.218 |
| 6,123,088 | A * | 9/2000 | Ho | C11D 7/3218 134/1.3 |
| 6,180,533 | B1 * | 1/2001 | Jain | H01L 21/3065 257/E21.218 |
| 6,235,643 | B1 * | 5/2001 | Mui | H01L 21/3065 156/345.24 |
| 6,270,634 | B1 * | 8/2001 | Kumar | H01J 37/321 204/192.32 |
| 6,277,752 | B1 * | 8/2001 | Chen | H01L 21/76224 257/E21.232 |

(Continued)

*Primary Examiner* — Mary Wilczewski
(74) *Attorney, Agent, or Firm* — Jacqueline J. Garner; Frank D. Cimino

(57) ABSTRACT

An integrated circuit may be formed by forming a sacrificial silicon nitride feature. At least a portion of the sacrificial silicon nitride feature may be removed by placing the integrated circuit in a two-step oxidized layer etch tool and removing a surface layer of oxidized silicon from the sacrificial silicon nitride feature using a two-step etch process. The two-step etch process exposes the integrated circuits to reactants from a plasma source at a temperature less than 40° C. and subsequently heating the integrated circuit to 80° C. to 120° C. while in the two-step oxidized layer etch tool. While the integrated circuit is in the two-step oxidized layer etch tool, without exposing the integrated circuit to an ambient containing more than 1 torr of oxygen, at least a portion of the sacrificial silicon nitride feature is removed using fluorine-containing etch reagents, substantially free of ammonia.

20 Claims, 20 Drawing Sheets

(56) References Cited

U.S. PATENT DOCUMENTS

| | | | | |
|---|---|---|---|---|
| 6,531,067 B1* | 3/2003 | Shiokawa | H01L 21/76802 | 216/17 |
| 6,531,404 B1* | 3/2003 | Nallan | H01L 21/32136 | 257/E21.311 |
| 7,482,247 B1* | 1/2009 | Papasouliotis | C23C 16/045 | 257/E21.245 |
| 7,501,349 B2* | 3/2009 | Dip | H01L 21/02046 | 438/706 |
| 7,951,683 B1* | 5/2011 | Shanker | C23C 16/045 | 257/E21.545 |
| 8,921,177 B2* | 12/2014 | Yeh | H01L 21/823807 | 257/E21.632 |
| 2003/0000913 A1* | 1/2003 | Hung | H01L 21/31116 | 216/2 |
| 2006/0051968 A1* | 3/2006 | Joshi | H01J 37/3266 | 438/723 |
| 2007/0238302 A1* | 10/2007 | Dip | H01L 21/02046 | 438/706 |
| 2008/0138997 A1* | 6/2008 | Huang | H01L 21/02063 | 438/734 |
| 2013/0023094 A1* | 1/2013 | Yeh | H01L 21/823807 | 438/218 |
| 2014/0187009 A1* | 7/2014 | Lii | H01L 21/823807 | 438/299 |

* cited by examiner

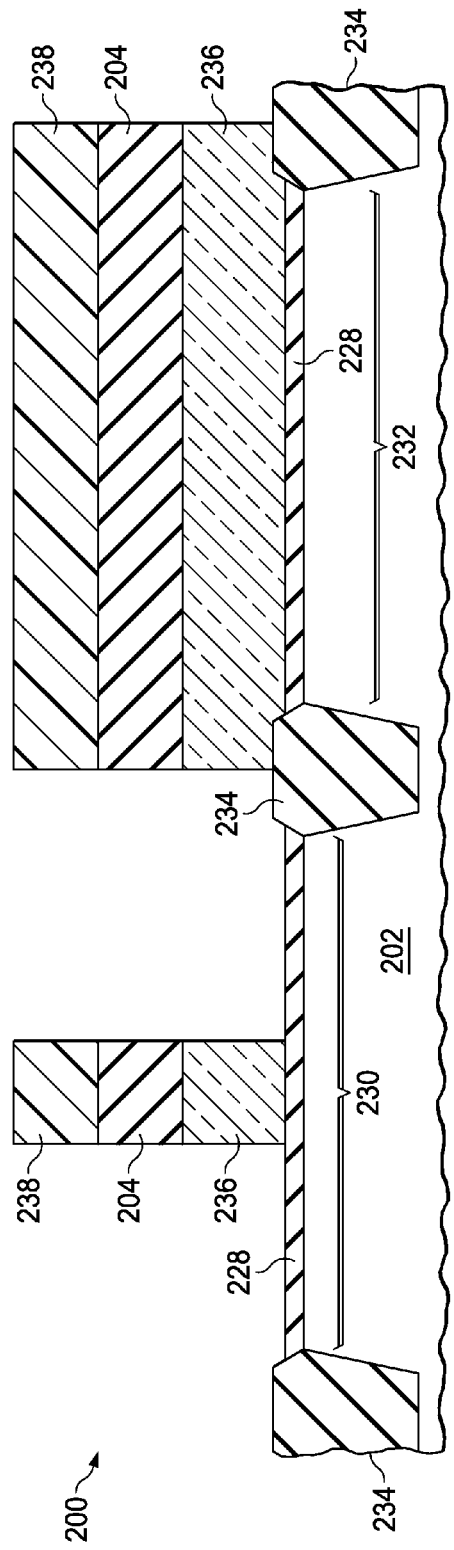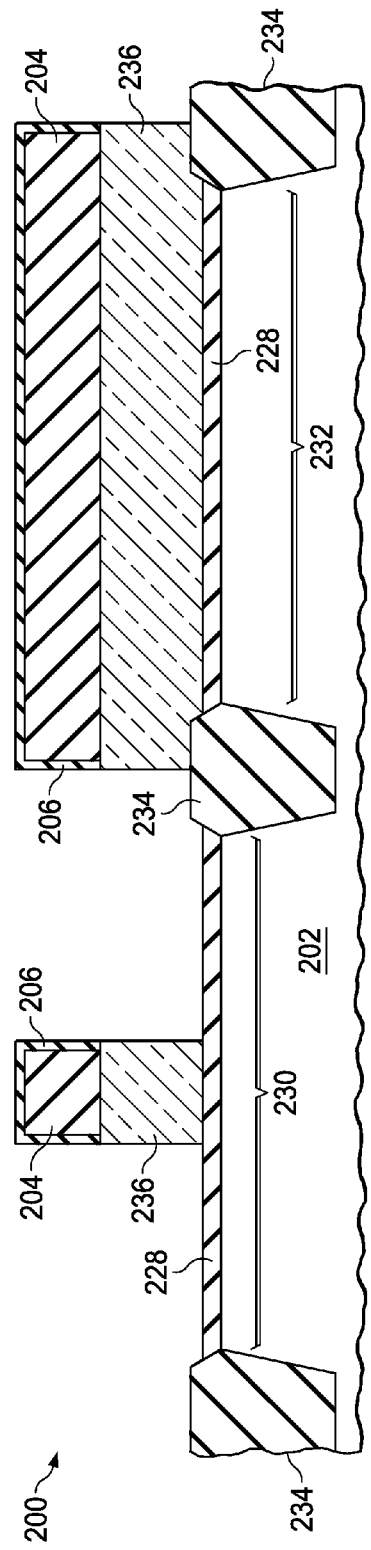

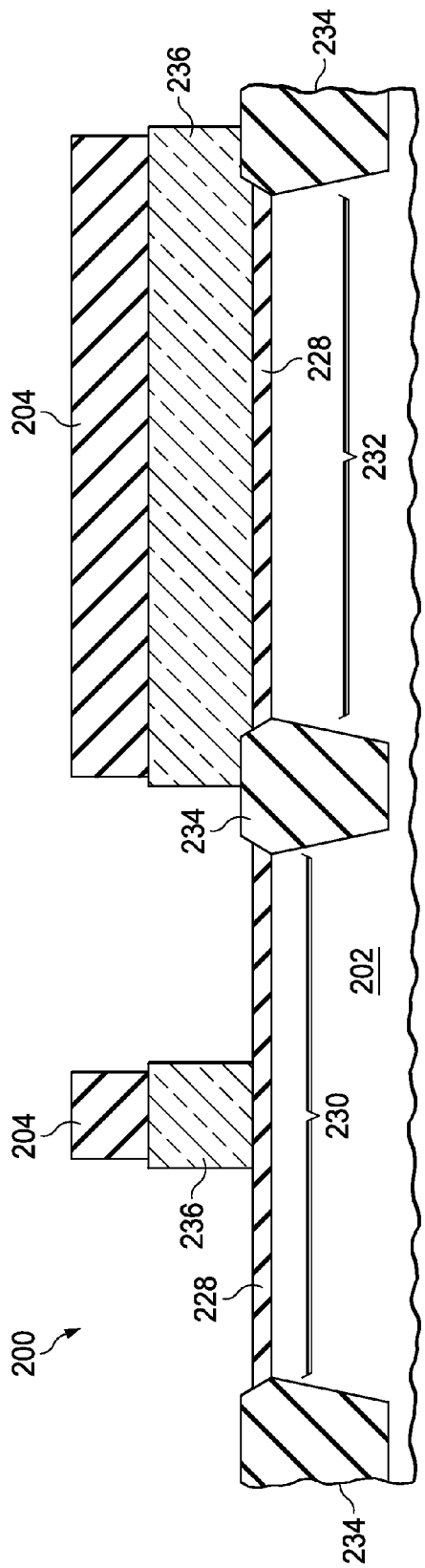
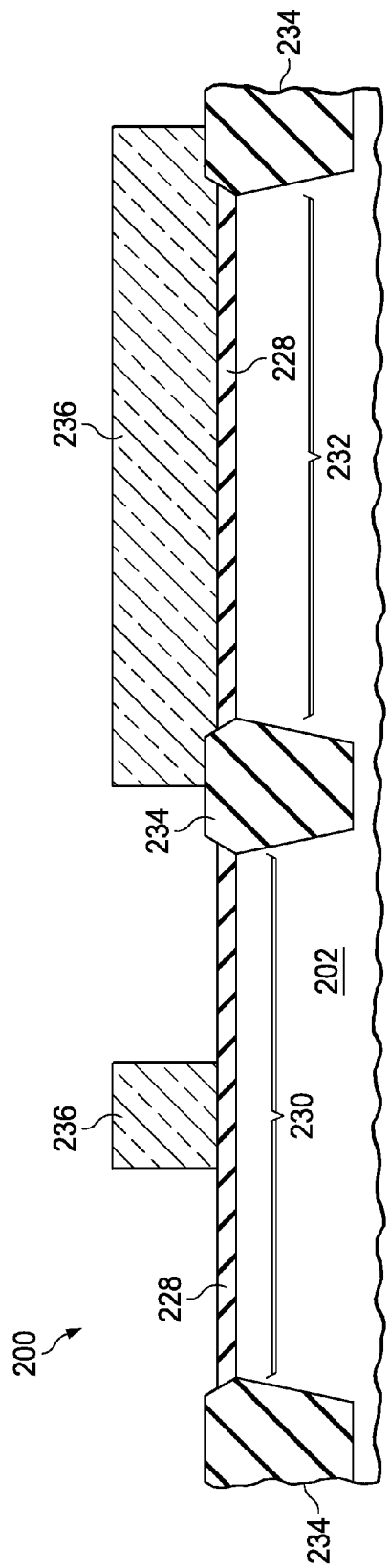
FIG. 2D
FIG. 2E

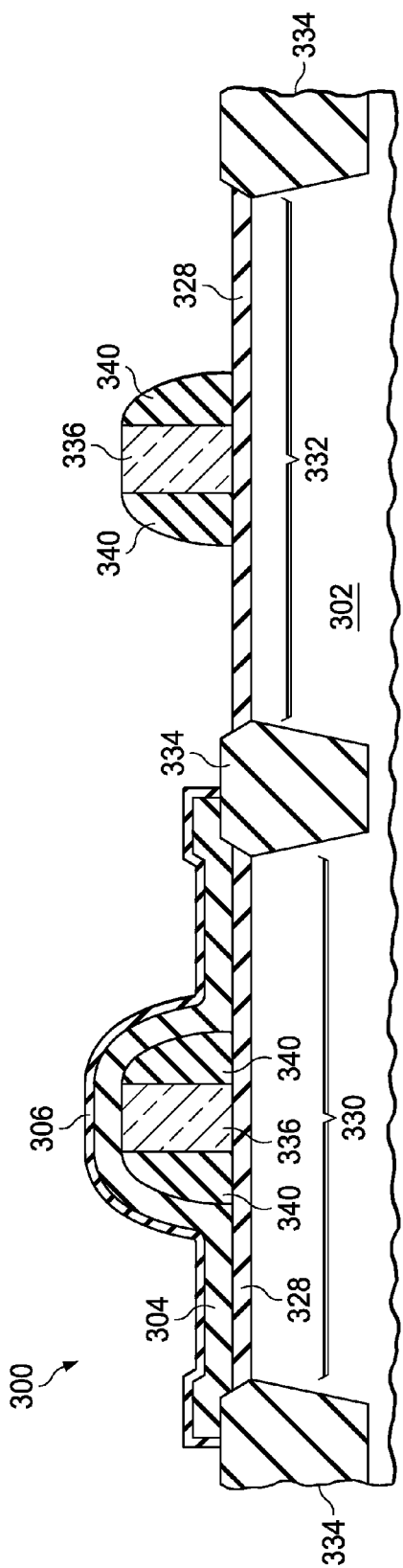
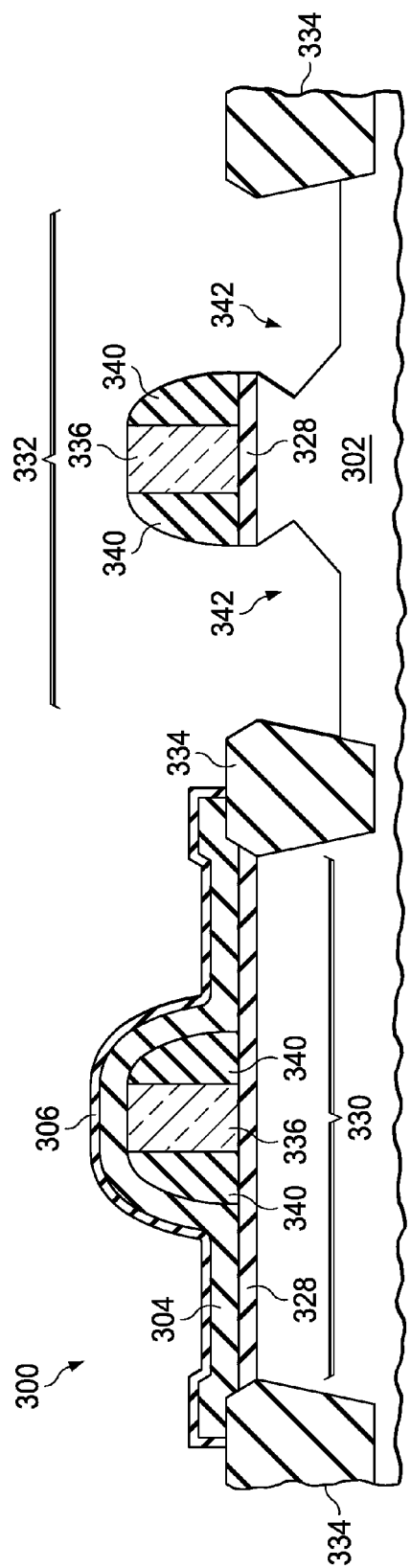
FIG. 3A
FIG. 3B

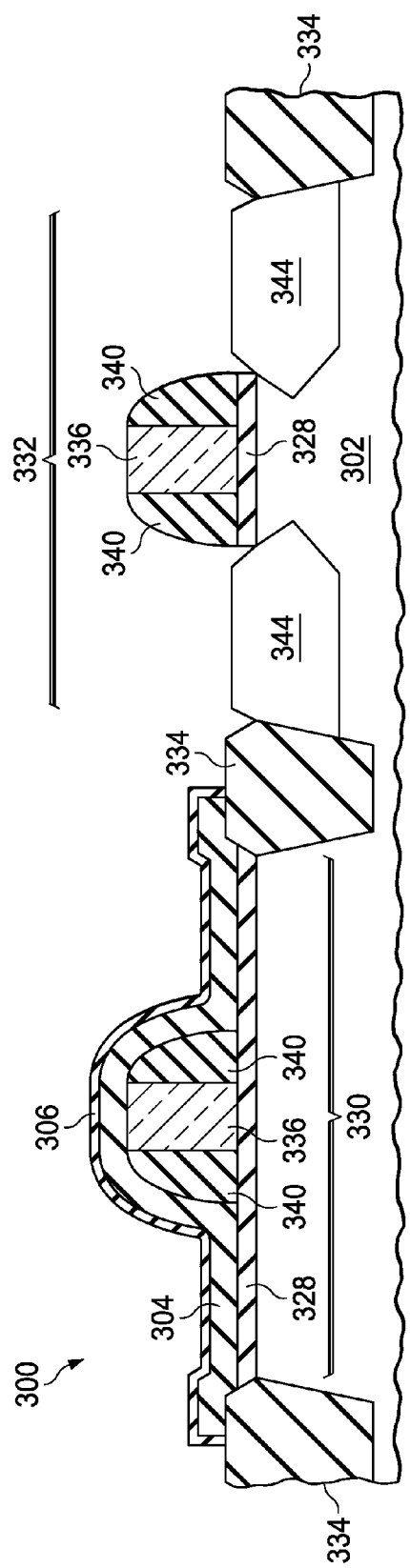
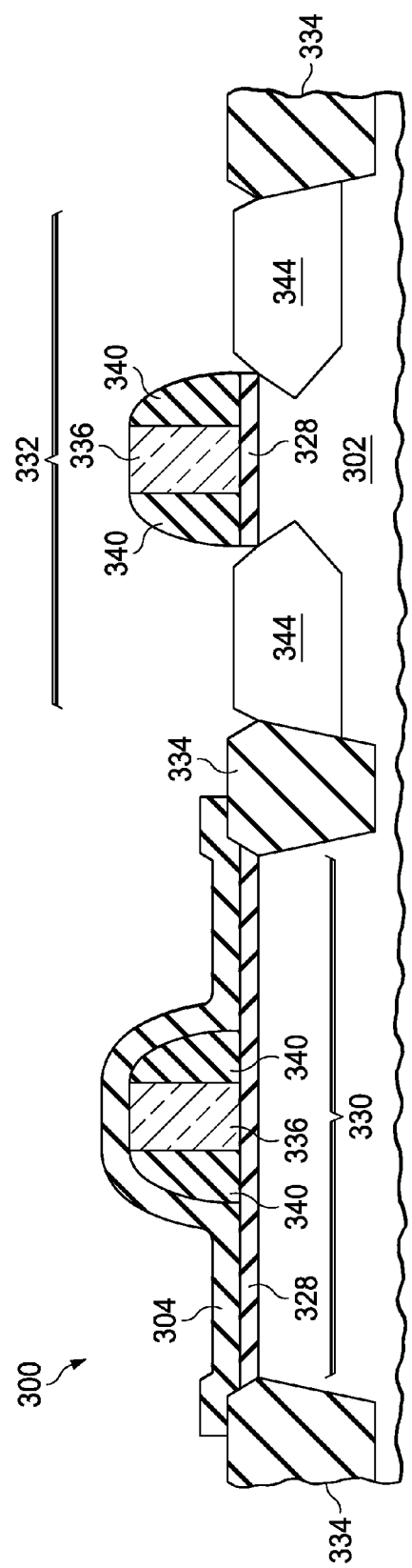
FIG. 3C
FIG. 3D

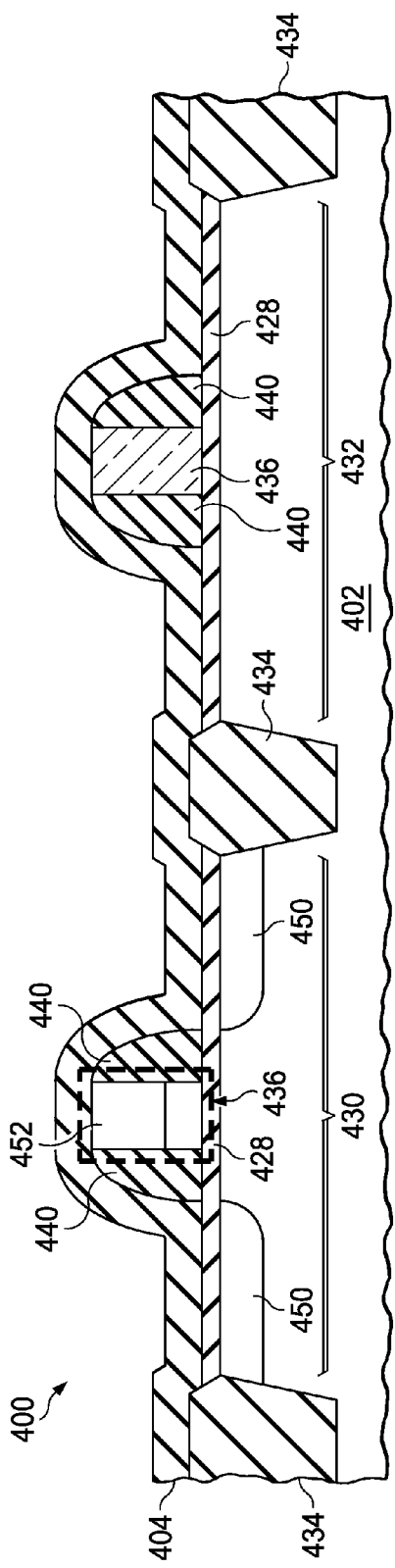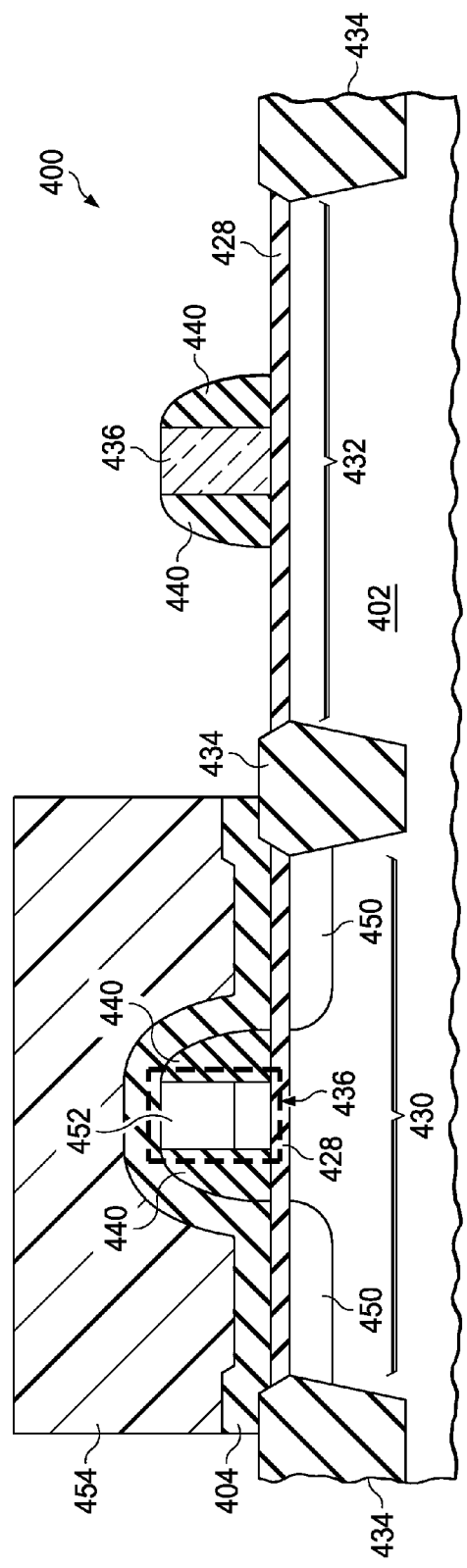
FIG. 4B
FIG. 4C

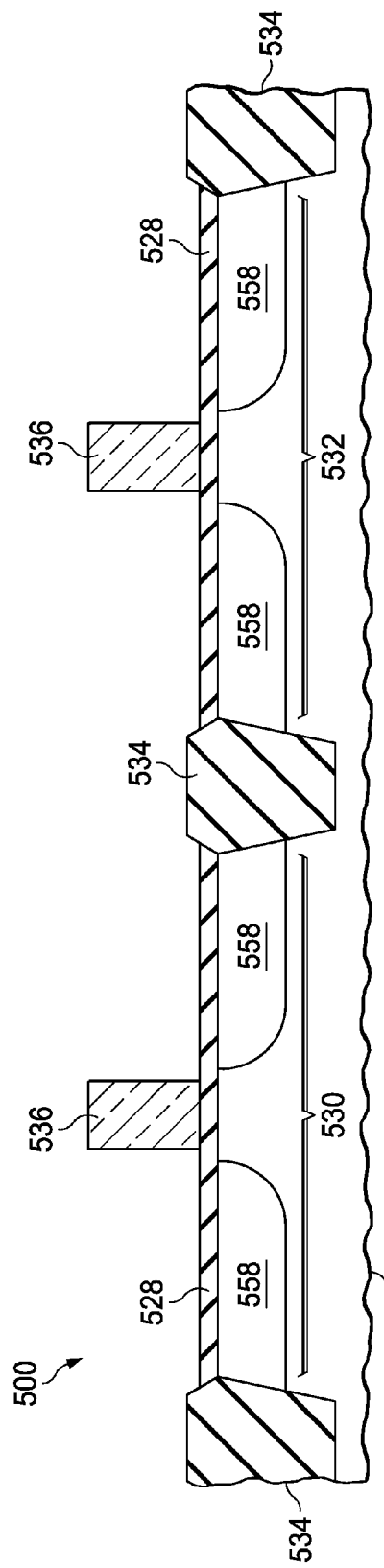
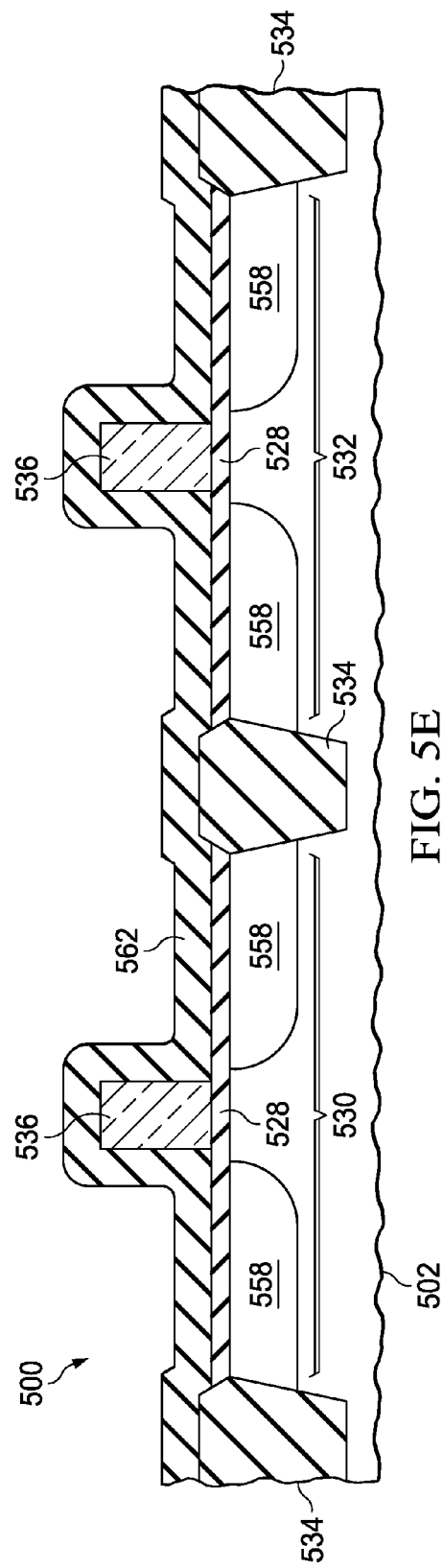
FIG. 5D
FIG. 5E

UNIFORM, DAMAGE FREE NITRIDE ETCH

CROSS-REFERENCE TO RELATED APPLICATIONS

This application claims the benefit of priority under U.S.C. §119(e) of U.S. Provisional Application 61/747,680 filed Dec. 31, 2012, which is hereby incorporated by reference in its entirety.

FIELD OF THE INVENTION

This invention relates to the field of integrated circuits. More particularly, this invention relates to thin films in integrated circuits.

BACKGROUND OF THE INVENTION

An integrated circuit may be formed using a temporary, or sacrificial, silicon nitride feature. A portion, or all, of the silicon nitride feature may be removed during fabrication of the integrated circuit. It may be desirable to remove the silicon nitride feature without damaging silicon dioxide features or silicon features of the integrated circuit, such as thin layers of silicon dioxide over active areas, gates, silicon dioxide spacers on gates, and/or the active areas. The silicon nitride feature may have a surface layer of oxidized silicon which may inhibit removal of the underlying silicon nitride feature. Conventional processes used to remove silicon nitride include wet etch using hot phosphoric acid and silicon nitride plasma etch.

Silicon nitride removal using hot phosphoric acid may result in non-uniform removal due to etch micro loading effects resulting in undesired non-uniformity of performance parameters of the integrated circuit. In addition, the hot phosphoric acid etch may be preceded by a dilute hydrofluoric acid etch to remove the surface layer of oxidized silicon from the silicon nitride feature. The dilute hydrofluoric acid etch may undesirably remove thin layers of silicon nitride over active areas and/or silicon dioxide spacers on gates. The subsequent hot phosphoric acid may undesirably attack exposed silicon, such as silicon active areas or polysilicon gates which were exposed by the dilute hydrofluoric acid etch.

A silicon nitride plasma etch may also be preceded by a plasma oxide etch to remove the surface layer of oxidized silicon from the silicon nitride. The plasma oxide etch uniformity and etch rate are difficult to control and may undesirably remove exposed silicon dioxide on active areas and/or gates, exposing the active areas and gates to the silicon nitride plasma etch, resulting in damage to the active areas and gates.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by forming a sacrificial silicon nitride feature. At least a portion of the sacrificial silicon nitride feature may be removed by placing the integrated circuit in a two-step oxidized layer etch tool and removing a surface layer of oxidized silicon from the sacrificial silicon nitride feature using a two-step etch process. The two-step etch process exposes the integrated circuits to reactants from a plasma source at a temperature less than 40° C. and subsequently heating the integrated circuit to 80° C. to 120° C. while in the two-step oxidized layer etch tool to remove etch by-products. While the integrated circuit is in the two-step oxidized layer etch tool, without exposing the integrated circuit to an ambient containing more than 1 torr of oxygen, at least a portion of the sacrificial silicon nitride feature is removed using fluorine-containing etch reagents, substantially free of ammonia.

DESCRIPTION OF THE VIEWS OF THE DRAWING

FIG. 2A through FIG. 2E are cross sections of an integrated circuit with a sacrificial silicon nitride feature during an example fabrication process, depicted in successive stages of formation.

FIG. 3A through FIG. 3E are cross sections of an integrated circuit with a sacrificial silicon nitride feature during an example fabrication process, depicted in successive stages of formation.

FIG. 4A through FIG. 4G are cross sections of an integrated circuit with sacrificial silicon nitride features during an example fabrication process, depicted in successive stages of formation.

FIG. 5A through FIG. 5F are cross sections of an integrated circuit with sacrificial silicon nitride features during an example fabrication process, depicted in successive stages of formation.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
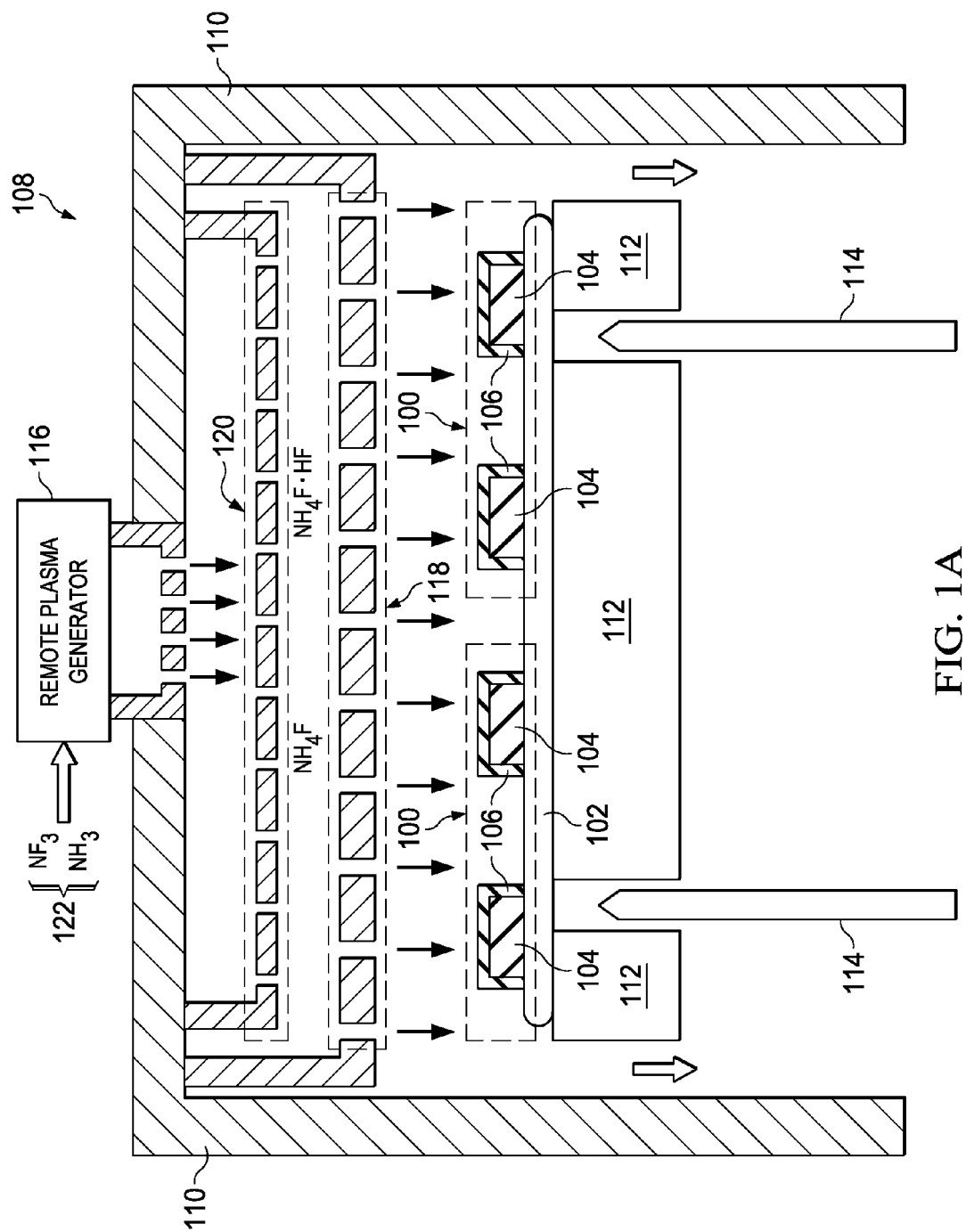
FIG. 1A through FIG. 1C are cross sections of an integrated circuit with a sacrificial silicon nitride feature during an example fabrication process, depicted in successive stages of formation.
Figure 1B:
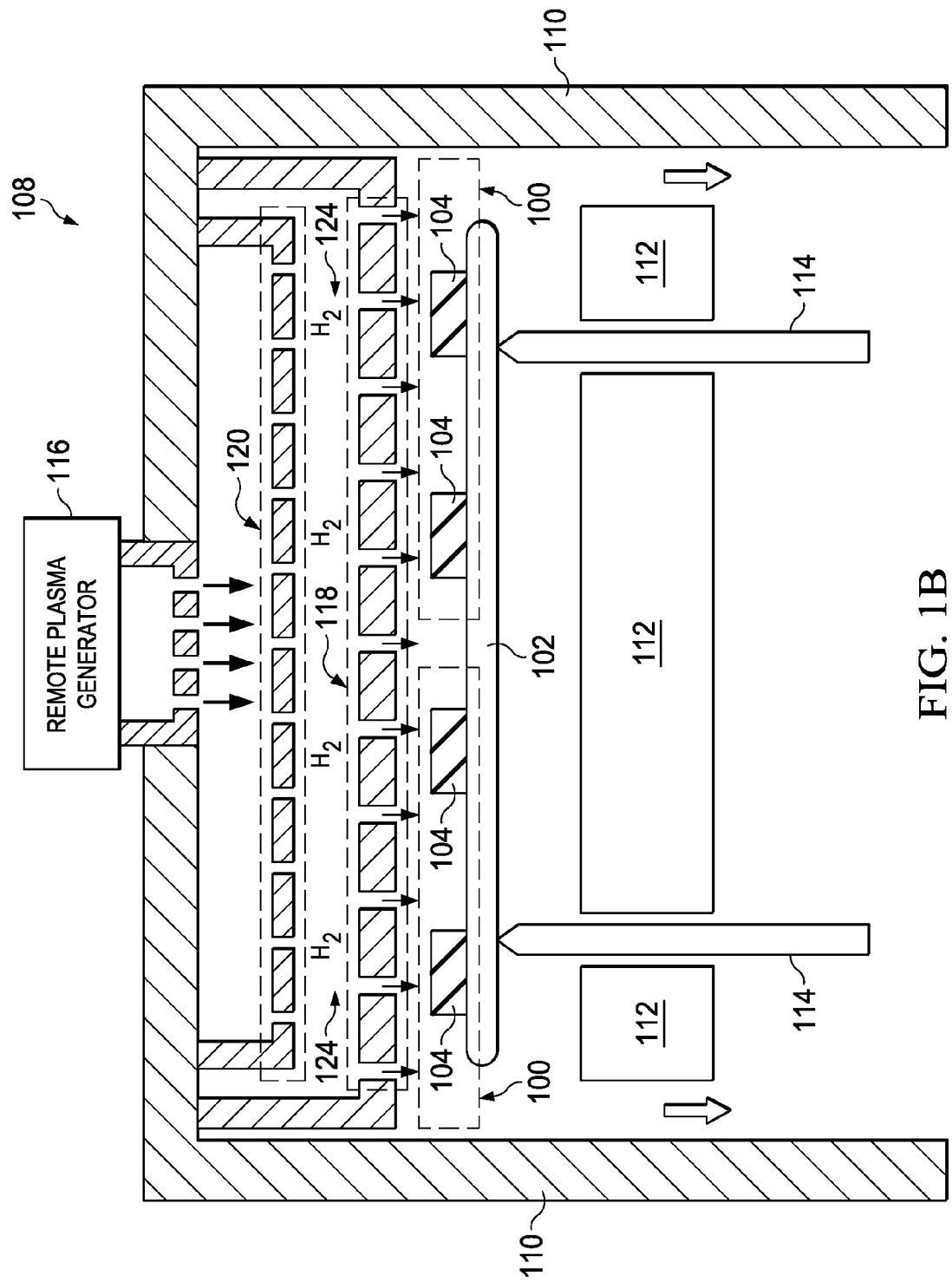
Figure 1C:
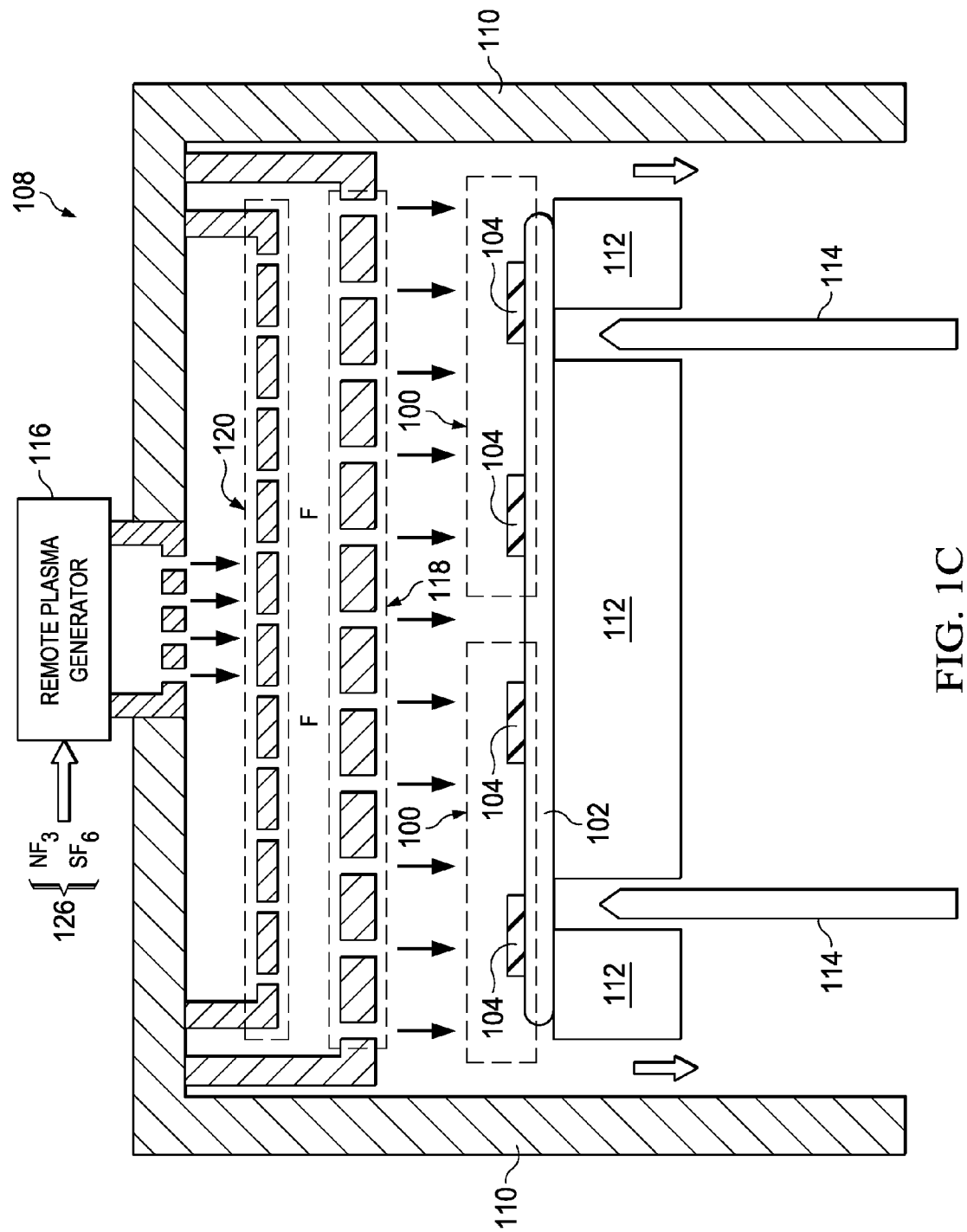

FIG. 1A through FIG. 1C are cross sections of an integrated circuit with a sacrificial silicon nitride feature during an example fabrication process, depicted in successive stages of formation. Referring to FIG. 1A, the integrated circuit 100 is formed on a substrate 102 which may be, for example, a semiconductor wafer. A plurality of integrated circuits 100 may be formed concurrently on the substrate 102. The integrated circuit 100 has sacrificial silicon nitride features 104; dimensions of the sacrificial silicon nitride features 104 are exaggerated in FIG. 1A through FIG. 1C to more clearly depict details of the example process. The sacrificial silicon nitride features 104 have a surface layer of oxidized silicon 106 which may be, for example, 2 Angstroms (Å) to 5 Å thick. The integrated circuit 100 is placed in a two-step oxidized layer etch tool 108 such as an Applied Materials Siconi Preclean tool. Inside a chamber 110 of the two-step oxidized layer etch tool 108, the integrated circuit 100 is placed on a substrate base 112 which is at a temperature less than 40° C., for example 25° C. to 35° C. Substrate pins 114 located below the substrate 102 are operable to raise the substrate 102 off the substrate base 112. The two-step oxidized layer etch tool 108 has a remote plasma generator 116 located over a heated showerhead 118 above the substrate base 112. The heated showerhead 118 is at a temperature above 90° C., for example 110° C. to 120° C. The two-step oxidized layer etch tool 108 may have one or more baffles 120 between the remote plasma generator 116 and the heated showerhead 118.

In a first step of a two-step process to remove the surface layer of oxidized silicon 106, reagents 122 including a fluorine-containing gas such as ammonium trifluoride ($NF_3$), and ammonia ($NH_3$) are provided to the remote plasma generator 116, along with an inert gas such as helium. A flow rate of the ammonium trifluoride may be, for example 10 standard cubic centimeters per minute (sccm) to 30 sccm, and a flow rate of the ammonia may be 3 to 6 times the flow rate of the ammonium trifluoride.

A plasma is generated using the reagents 122 and inert gas, producing fluorine radicals such as $NH_4F$ and $NH_4F \cdot HF$ which flow through the heated showerhead 118 and adsorb onto an existing top surface of the integrated circuit 100, including on the surface layer of oxidized silicon 106. The adsorbed fluorine radicals react with the surface layer of oxidized silicon 106 to produce silicon-fluorine by-products, such as $NH_4 \cdot SF_6$, which remain on the surface layer of oxidized silicon 106. After sufficient fluorine radicals have been adsorbed and reacted so as to remove the surface layer of oxidized silicon 106, for example after 10 seconds to 60 seconds, flow of the reagents 122 is turned off and the fluorine radicals are purged from the chamber 110.

Referring to FIG. 1B, in a second step of the two-step process to remove the surface layer of oxidized silicon 106, hydrogen gas ($H_2$) 124 is flowed through the heated showerhead 118 onto the integrated circuit 100. The substrate pins 114 are raised, lifting the substrate 102 off the substrate base 112 so that an existing top surface of the integrated circuit 100 is within 5 millimeters of the heated showerhead 118. The hydrogen gas 124 transfers heat from the heated showerhead 118 to the silicon-fluorine by-products, causing the silicon-fluorine by-products to sublime and be removed from the chamber 110. The substrate 102 may be held proximate to the heated showerhead 118 for a sufficient time, for example, 30 seconds to 120 seconds, for the silicon-fluorine by-products to sublime from the sacrificial silicon nitride features 104 and be removed from the chamber 110. The sacrificial silicon nitride features 104 are substantially free of the surface layer of oxidized silicon 106 of FIG. 1A. Removing the surface layer of oxidized silicon 106 using the two-step process of FIG. 1A and FIG. 1B may advantageously keep removal of exposed silicon dioxide and silicon in the integrated circuit 100 within acceptable limits. The integrated circuit 100 is not exposed to an ambient containing more than 1 torr of oxygen between removal of the surface layer of oxidized silicon 106 and subsequent removal of at least a portion of the sacrificial silicon nitride features 104 as described in reference to FIG. 1C.

Referring to FIG. 1C, the substrate pins 114 are lowered so that the substrate 102 rests on the substrate base 112. Fluorine-containing reagents 126 such as ammonium trifluoride and/or sulfur hexafluoride ($SF_6$), substantially free of ammonia, are provided to the remote plasma generator 116, along with an inert gas such as helium. A plasma is generated using the reagents 126 and inert gas, producing fluorine radicals such as fluorine atoms (F) which flow through the heated showerhead 118 and onto an existing top surface of the integrated circuit 100, including on the sacrificial silicon nitride features 104. The fluorine radicals react with silicon in the sacrificial silicon nitride features 104 so as to remove at least a portion, possibly all, of the sacrificial silicon nitride features 104. The flow rates of the reagents 126 and power in the remote plasma generator 116 may be selected to provide a desired selectivity to silicon nitride with respect to silicon dioxide and silicon, so that removal of exposed silicon dioxide and silicon in the integrated circuit 100 is kept within acceptable limits. After a desired portion of the sacrificial silicon nitride features 104 is removed, flow of the reagents 126 is turned off and the fluorine radicals are purged from the chamber 110.

Figure 2A:
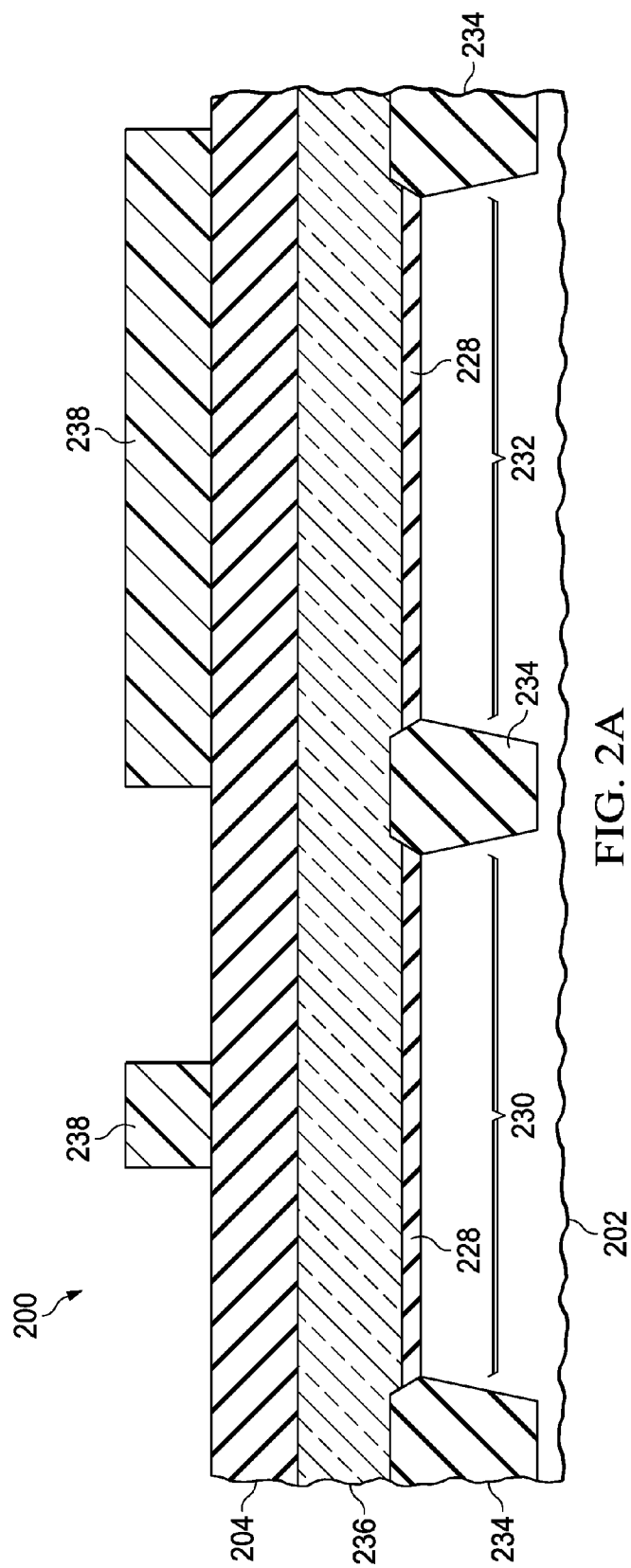

FIG. 2A through FIG. 2E are cross sections of an integrated circuit with a sacrificial silicon nitride feature during an example fabrication process, depicted in successive stages of formation. Referring to FIG. 2A, the integrated circuit 200 is formed on a substrate 202, for example a semiconductor wafer such as a silicon wafer. A gate dielectric layer 228 is formed at a top surface of the substrate 202 in an area for a first transistor 230 and an area for a second transistor 232. Field oxide 234 may be formed at the top surface of the substrate 202 to laterally isolate the first transistor 230 and the second transistor 232. A layer of gate material 236, such as polycrystalline silicon, referred to as polysilicon, is formed over the gate dielectric layer 228. A sacrificial silicon nitride layer 204 is formed over the layer of gate material 236, for example to provide an anti-reflection layer or a hard mask layer. A gate mask 238 is formed over the sacrificial silicon nitride layer 204 so as to cover areas for gates of the first transistor 230 and the second transistor 232. The gate mask 238 may include photoresist or other carbon-containing material such as amorphous carbon.

Referring to FIG. 2B, a gate etch process removes silicon nitride from the sacrificial silicon nitride layer 204 and removes gate material from the layer of gate material 236 in areas exposed by the gate mask 238. Elements of the sacrificial silicon nitride layer 204 on the separate elements of the layer of gate material 236 are sacrificial silicon nitride features. After the gate etch process is completed, the gate mask 238 is removed, for example using an oxygen plasma process.

Referring to FIG. 2C, the gate etch process and removal of the gate mask 238 of FIG. 2B form a surface layer of oxidized silicon 206 at exposed surfaces of the sacrificial silicon nitride layer 204. The integrated circuit 200 is placed in a two-step oxidized layer etch tool on a substrate base maintained at a temperature less than 40° C. A first step of a two-step process to remove the surface layer of oxidized silicon 206 is performed, for example as described in reference to FIG. 1A, in which reagents including a fluorine-containing gas and ammonia are provided to a remote plasma generator of the two-step oxidized layer etch tool, along with an inert gas. A plasma is generated using the reagents and inert gas, producing fluorine radicals which flow through a heated element, such as a heated showerhead, of the two-step oxidized layer etch tool and adsorb onto an existing top surface of the integrated circuit 200, including on the surface layer of oxidized silicon 206. The adsorbed fluorine radicals react with the surface layer of oxidized silicon 206 to produce silicon-fluorine by-products which remain on the surface layer of oxidized silicon 206.

Referring to FIG. 2D, a second step of the two-step process is performed, for example as described in reference to FIG. 1B, in which the integrated circuit 200 is raised off the substrate base and within 5 millimeters of the heated showerhead. Heat is transferred from the heated showerhead to the silicon-fluorine by-products, causing the silicon-fluorine by-products to sublime and be removed from a chamber of the two-step oxidized layer etch tool. The gate dielectric layer 228 is advantageously not removed by the two-step process. The layer of gate material 236 is advantageously not significantly etched by the two-step process. The integrated circuit 200 is not exposed to an ambient containing more than 1 torr of oxygen between removal of the surface layer of oxidized silicon 206 and subsequent removal of at least a portion of the sacrificial silicon nitride layer 204.

Referring to FIG. 2E, the integrated circuit 200 is lowered onto the substrate base. Fluorine-containing reagents, substantially free of ammonia, are provided to the remote plasma generator, along with an inert gas such as helium. A plasma is generated using the reagents and inert gas, producing fluorine radicals which flow through the heated showerhead and onto an existing top surface of the integrated circuit 200, including on the sacrificial silicon nitride layer 204. The fluorine radicals react with silicon in the sacrificial silicon nitride layer 204 so as to remove the sacrificial silicon nitride layer 204. The gate dielectric layer 228 is advantageously not removed by the fluorine radicals. The layer of gate material 236 is advantageously not significantly etched by the fluorine radicals.

Figure 3E:
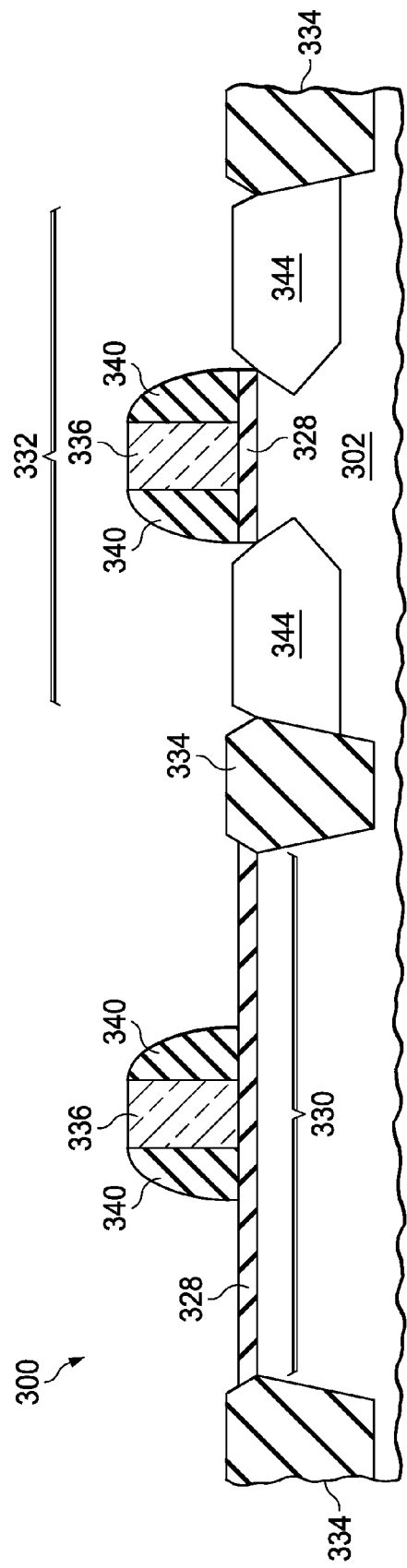

FIG. 3A through FIG. 3E are cross sections of an integrated circuit with a sacrificial silicon nitride feature during an example fabrication process, depicted in successive stages of formation. Referring to FIG. 3A, the integrated circuit 300 is formed on a substrate 302, for example a semiconductor wafer such as a silicon wafer. A gate dielectric layer 328 is formed at a top surface of the substrate 302 in an area for a first transistor 330 and an area for a second transistor 332. Field oxide 334 may be formed at the top surface of the substrate 302 to laterally isolate the first transistor 330 and the second transistor 332. Gates 336 of the first transistor 330 and the second transistor 332 are formed over the gate dielectric layer 328. The gates 336 may include polysilicon or other gate material such as cobalt silicide or titanium nitride. Sidewall spacers 340 are formed on lateral surfaces of the gates 336. The sidewall spacers 340 may include one or more layers of silicon dioxide and/or silicon nitride.

A sacrificial silicon nitride mask 304 is formed over the first transistor 330 so as to expose the second transistor 332. The sacrificial silicon nitride mask 304 is a sacrificial silicon nitride feature. The sacrificial silicon nitride mask 304 may be formed, for example, by forming a conformal layer of silicon nitride over an existing top surface of the integrated circuit 300 including the first transistor 330 and the second transistor 332, for example by a plasma enhanced chemical vapor deposition (PECVD) process using bis(tertiary-butylamino)silane, referred to as BTBAS. An etch mask is formed over the conformal layer of silicon nitride so as to cover the first transistor 330 and expose the second transistor 332. Silicon nitride is removed from the conformal layer of silicon nitride in areas exposed by the etch mask to leave the sacrificial silicon nitride mask 304. The etch mask is subsequently removed. Removal of the etch mask and subsequent process steps form a surface layer of oxidized silicon 306 at exposed surfaces of the sacrificial silicon nitride mask 304.

Referring to FIG. 3B, source/drain cavities 342 are formed in the second transistor 332 by removing semiconductor material from the substrate 302 adjacent to the gate 336 and sidewall spacers 340 of the second transistor 332. The semiconductor material may be removed by a combination of a reactive ion etch (RIE) process and a crystallographic wet etch. The sacrificial silicon nitride mask 304 prevents removal of semiconductor material from the first transistor 330.

Referring to FIG. 3C, silicon-germanium source/drain regions 344 are formed in the source/drain cavities 342 of FIG. 3B, by a selective epitaxial growth process. The sacrificial silicon nitride mask 304 blocks epitaxial growth on the first transistor 330. After the silicon-germanium source/drain regions 344 are formed, the integrated circuit 300 is placed in a two-step oxidized layer etch tool on a substrate base maintained at a temperature less than 40° C. A first step of a two-step process to remove the surface layer of oxidized silicon 306 is performed, for example as described in reference to FIG. 1A, in which a fluorine-containing gas, ammonia and an inert gas are provided to a remote plasma generator of the two-step oxidized layer etch tool. The remote plasma generator generates a plasma, producing fluorine radicals which flow through a heated element, such as a heated showerhead, of the two-step oxidized layer etch tool and adsorb onto an existing top surface of the integrated circuit 300, including on the surface layer of oxidized silicon 306. The adsorbed fluorine radicals react with the surface layer of oxidized silicon 306 to produce silicon-fluorine by-products which remain on the surface layer of oxidized silicon 306.

Referring to FIG. 3D, a second step of the two-step process is performed, for example as described in reference to FIG. 1B, in which the integrated circuit 300 is raised off the substrate base to within 5 millimeters of the heated element. The silicon-fluorine by-products are heated by gas flowing through the heated element, causing the silicon-fluorine by-products to sublime and be removed. The silicon-germanium source/drain regions 344 are advantageously not significantly etched by the two-step process. The gate 336 of the second transistor 332 is also advantageously not significantly etched by the two-step process. The integrated circuit 300 is not exposed to an ambient containing more than 1 torr of oxygen between removal of the surface layer of oxidized silicon 306 and subsequent removal of at least a portion of the sacrificial silicon nitride mask 304.

Referring to FIG. 3E, the integrated circuit 300 is lowered onto the substrate base. Fluorine-containing reagents, substantially free of ammonia, are provided to the remote plasma generator, along with an inert gas. A plasma is generated using the reagents and inert gas, producing fluorine radicals which flow through the heated element and onto an existing top surface of the integrated circuit 300, including on the sacrificial silicon nitride mask 304. The fluorine radicals react with silicon in the sacrificial silicon nitride mask 304 so as to remove the sacrificial silicon nitride mask 304. The gate dielectric layer 328 is advantageously not removed by the fluorine radicals. The gates 336 are advantageously not significantly etched by the fluorine radicals.

Figure 4A:
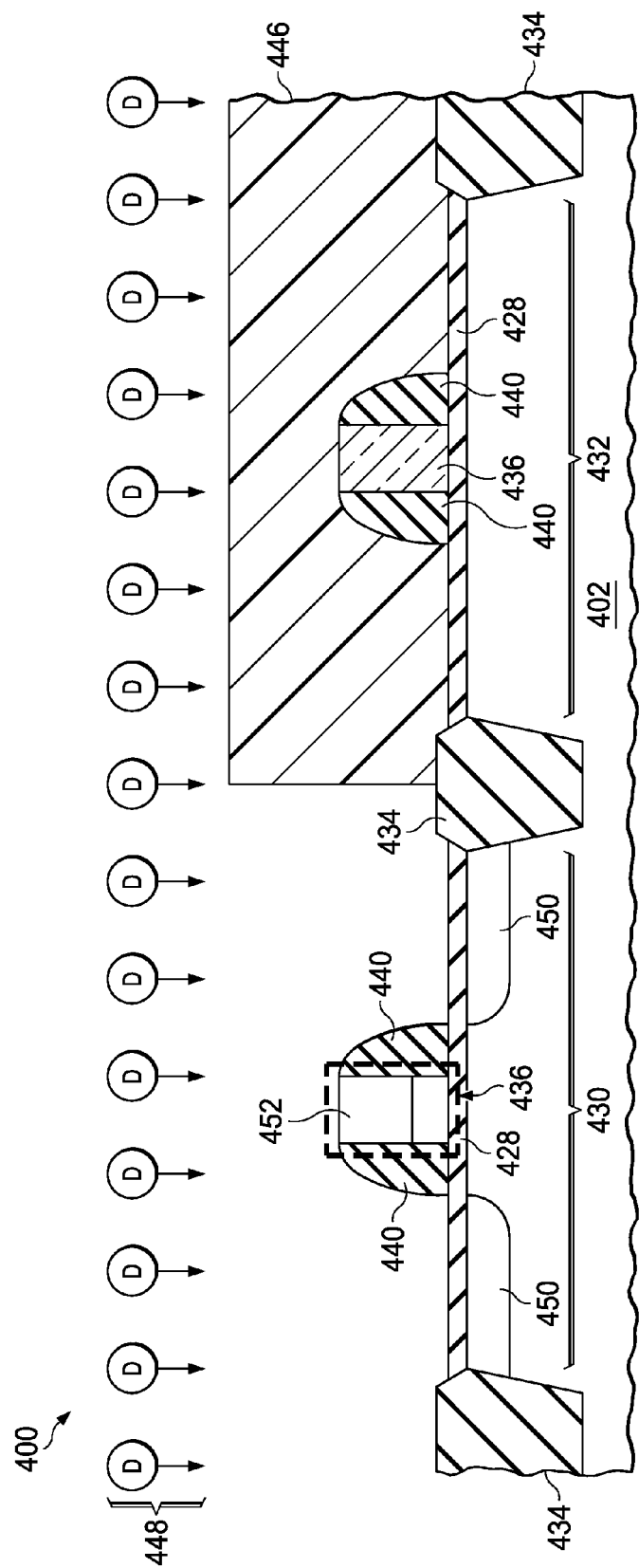

FIG. 4A through FIG. 4G are cross sections of an integrated circuit with sacrificial silicon nitride features during an example fabrication process, depicted in successive stages of formation. Referring to FIG. 4A, the integrated circuit 400 is formed on a substrate 402, such as a silicon wafer. A gate dielectric layer 428 is formed at a top surface of the substrate 402 in an area for a first transistor 430 and an area for a second transistor 432. Field oxide 434 may be formed at the top surface of the substrate 402 to laterally isolate the first transistor 430 and the second transistor 432. Gates 436 of the first transistor 430 and the second transistor 432 are formed over the gate dielectric layer 428. In the instant example, the gates 436 are predominantly polysilicon. Sidewall spacers 440 are formed on lateral surfaces of the gates 436. The sidewall spacers 440 may include one or more layers of silicon dioxide and/or silicon nitride.

A source/drain mask 446 is formed over the second transistor 432 so as to expose the first transistor 430. The source/drain mask 446 may include photoresist and possibly other organic materials. Dopants 448 are implanted into the first transistor 430 to form source/drain implanted regions 450 in the substrate 402 adjacent to the sidewall spacers 440 of the first transistor 430. The dopants 448 are also implanted concurrently into the gate 436 of the first transistor 430 to form a gate implanted region 452. A total dose of the dopants 448 may be, for example, $1 \times 10^{15}$ cm$^{-2}$ to $1 \times 10^{17}$ cm$^{-2}$, and is sufficient to at least partly amorphize the gate implanted region 452. The source/drain implanted regions 450 may also be partly amorphized by the implanted dopants 448. The source/drain mask 446 is removed after the dopants 448 are implanted.

Referring to FIG. 4B, a conformal layer of stressed silicon nitride 404 is formed over an existing top surface of the integrated circuit 400, covering the first transistor 430 and the second transistor 432. The conformal layer of stressed silicon nitride 404 has a stress greater than 100 megapascals (MPa), either tensile or compressive, as needed to provide increased on-state current in the first transistor 430. The conformal layer of stressed silicon nitride 404 may be formed by a PECVD process. The gate implanted region 452 remains at least partly amorphized through formation of the conformal layer of stressed silicon nitride 404.

Referring to FIG. 4C, an optional stressor mask 454 may be formed over the conformal layer of stressed silicon nitride 404 in the area for the first transistor 430, so as to expose the conformal layer of stressed silicon nitride 404 in the area for the second transistor 432. An etch process removes silicon nitride from the conformal layer of stressed silicon nitride 404 in areas exposed by the stressor mask 454, leaving the conformal layer of stressed silicon nitride 404 over the first transistor 430. The conformal layer of stressed silicon nitride 404 is a sacrificial silicon nitride feature. The stressor mask 454 is removed after the etch process is completed, for example by an oxygen plasma and/or a wet etch using an aqueous mixture of sulfuric acid and hydrogen peroxide.

Figure 4D:
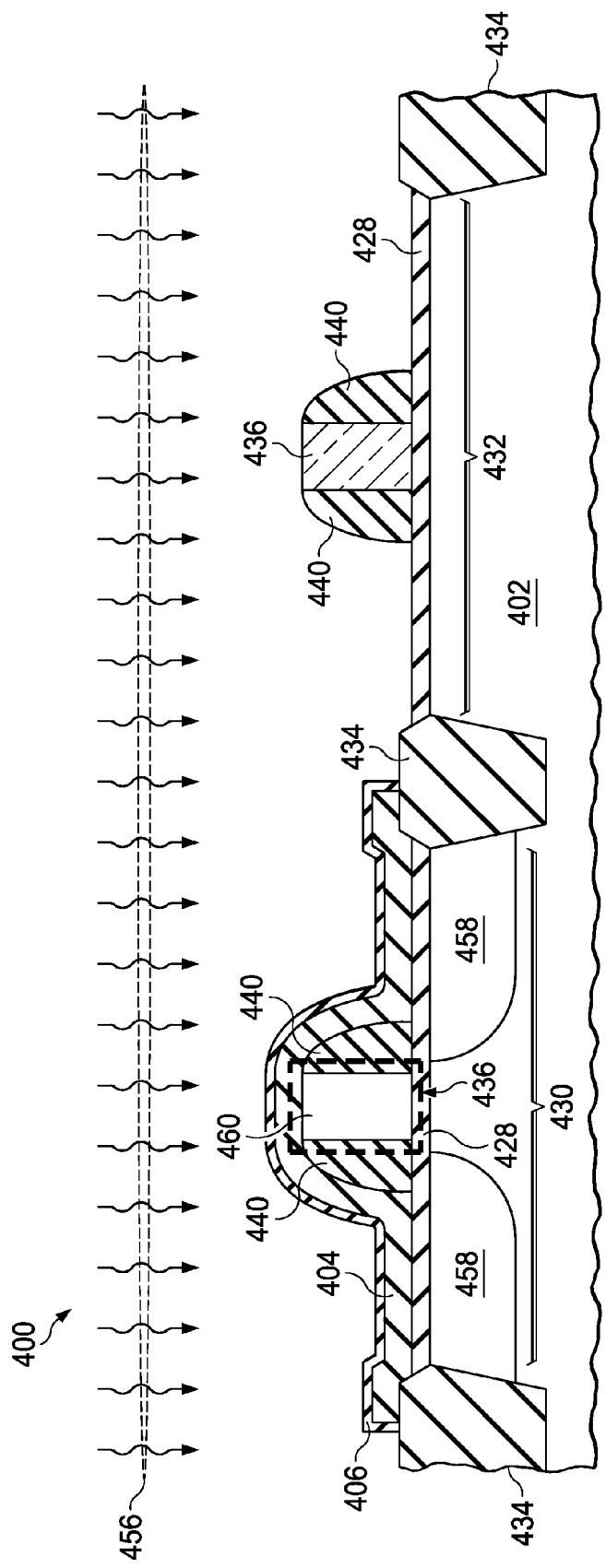

Referring to FIG. 4D, removal of the stressor mask 454 of FIG. 4C, and possibly other process steps, forms a surface layer of oxidized silicon 406 at exposed surfaces of the conformal layer of stressed silicon nitride 404. An anneal process is performed which heats the integrated circuit 400 using a rapid thermal processor (RTP) tool or a laser anneal tool, as depicted in FIG. 4D by heat radiation 456, which activates at least a portion of the implanted dopants in the source/drain implanted regions 450 of FIG. 4C to form source/drain regions 458. The anneal process also recrystallizes the gate implanted region 452 of FIG. 4C to form a doped gate 460 of the first transistor 430 with lateral dimensions of the doped gate 460 determined by the stress in the conformal layer of stressed silicon nitride 404. It is desirable to remove the conformal layer of stressed silicon nitride 404 without significantly etching the doped gate 460 or the gate dielectric layer 428 over the source/drain regions 458. When the conformal layer of stressed silicon nitride 404 is removed, the doped gate 460 will desirably apply stress to a channel region in the substrate 402 under the gate dielectric layer 428 between the source/drain regions 458 to increase the on-state current of the first transistor 430.

Figure 4E:
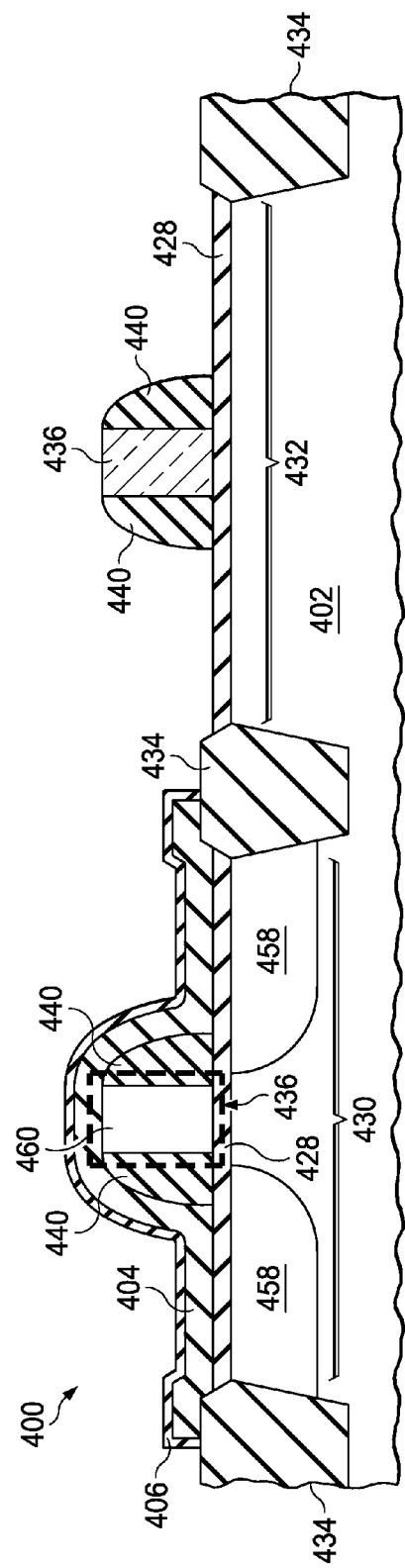

Referring to FIG. 4E, the integrated circuit 400 is placed in a two-step oxidized layer etch tool on a substrate base maintained at a temperature less than 40° C. A first step of a two-step process to remove the surface layer of oxidized silicon 406 is performed, for example as described in reference to FIG. 1A, in which a fluorine-containing gas, ammonia and an inert gas are provided to a remote plasma generator of the two-step oxidized layer etch tool. The remote plasma generator generates a plasma, producing fluorine radicals which flow through a heated element of the two-step oxidized layer etch tool and adsorb onto an existing top surface of the integrated circuit 400, including on the surface layer of oxidized silicon 406. The adsorbed fluorine radicals react with the surface layer of oxidized silicon 406 to produce silicon-fluorine by-products which remain on the surface layer of oxidized silicon 406.

Figure 4F:
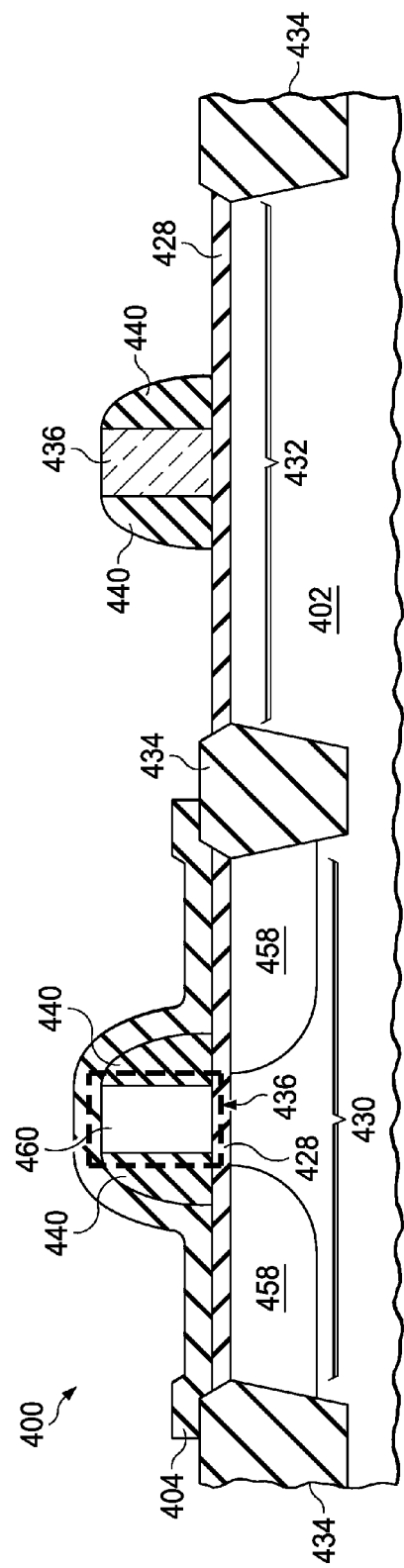

Referring to FIG. 4F, a second step of the two-step process is performed, for example as described in reference to FIG. 1B, in which the integrated circuit 400 is raised off the substrate base to a position proximate to the heated element. The silicon-fluorine by-products are heated by gas flowing through the heated element, causing the silicon-fluorine by-products to sublime and be removed. The doped gate 460 or the gate dielectric layer 428 over the source/drain regions 458 are advantageously not significantly etched by the two-step process. The gate 436 and the gate dielectric layer 428 of the second transistor 432 are also advantageously not significantly etched by the two-step process. The integrated circuit 400 is not exposed to an ambient containing more than 1 torr of oxygen between removal of the surface layer of oxidized silicon 406 and subsequent removal of at least a portion of the conformal layer of stressed silicon nitride 404.

Figure 4G:
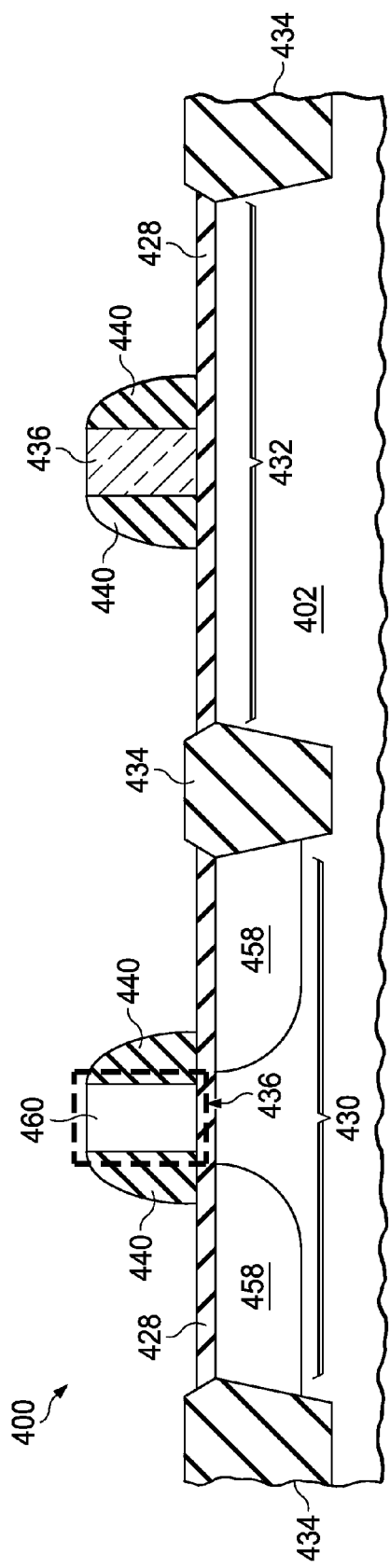

Referring to FIG. 4G, the integrated circuit 400 is lowered onto the substrate base. Fluorine-containing reagents, substantially free of ammonia, and an inert gas are provided to the remote plasma generator. A plasma is generated using the reagents and inert gas, producing fluorine radicals which flow through the heated element and onto an existing top surface of the integrated circuit 400, including on the conformal layer of stressed silicon nitride 404. The fluorine radicals react with silicon in the conformal layer of stressed silicon nitride 404 so as to remove the conformal layer of stressed silicon nitride 404. The gate dielectric layer 428 in the first transistor 430 and second transistor 432 is advantageously not removed by the fluorine radicals. The doped gate 460 of the first transistor 430 and the gate 436 of the second transistor 432 are advantageously not significantly etched by the fluorine radicals.

Figure 5A:
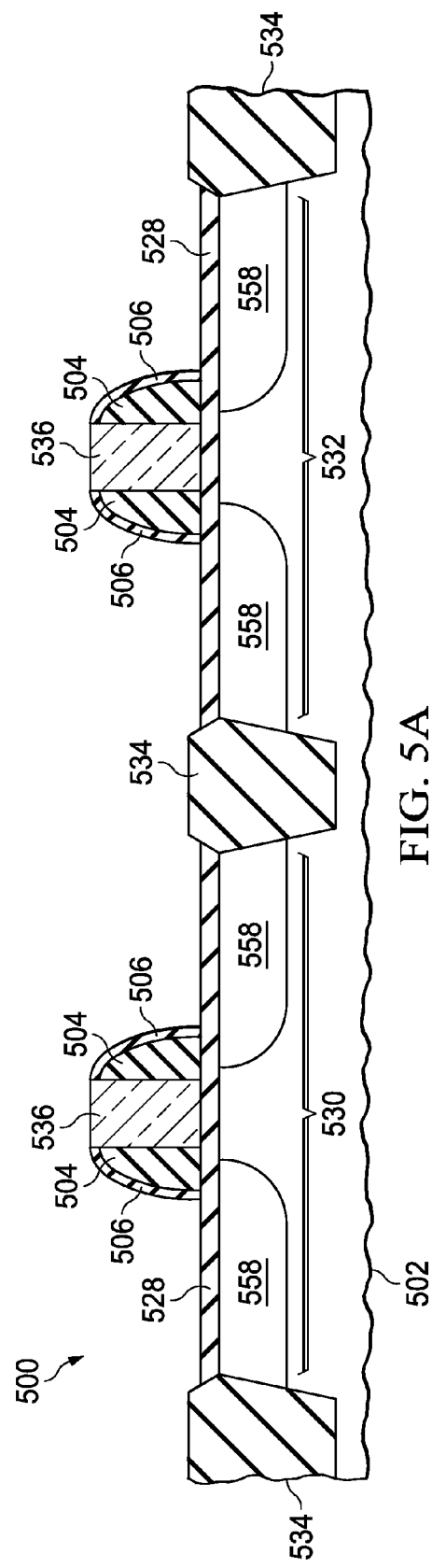

FIG. 5A through FIG. 5F are cross sections of an integrated circuit with sacrificial silicon nitride features during an example fabrication process, depicted in successive stages of formation. Referring to FIG. 5A, the integrated circuit 500 is formed on a substrate 502, such as a silicon wafer. A gate dielectric layer 528 is formed at a top surface of the substrate 502 in an area for a first transistor 530 and an area for a second transistor 532. Field oxide 534 may be formed at the top surface of the substrate 502 to laterally isolate the first transistor 530 and the second transistor 532. Gates 536 of the first transistor 530 and the second transistor 532 are formed over the gate dielectric layer 528. Sidewall spacers 504 are formed of silicon nitride on lateral surfaces of the gates 536, for example by forming a conformal layer of silicon nitride over an existing top surface of said integrated circuit and anisotropically etching the conformal layer of silicon nitride to leave the sidewall spacers 504. The sidewall spacers 504 are sacrificial silicon nitride features. A surface layer of oxidized silicon 506 is formed at exposed surfaces of the sidewall spacers 504 by exposure to oxidizing ambients during fabrication of the integrated circuit 500. Source/drain regions 558 of the first transistor 530 and second transistor 532 are formed by implanting dopants into the substrate 502 while the sidewall spacers 504 are in place. An initial width of the sidewall spacers 504 is selected to provide a desired lateral separation between the source/drain regions 558 and the gate 536 of the first transistor 530, and between the source/drain regions 558 and the gate 536 of the second transistor 532. It may be desirable to reduce the width of the sidewall spacers 504, or optionally to remove the sidewall spacers 504, prior to forming a permanent stress layer over the first transistor 430, so as to more effectively transfer stress from the permanent stress layer to a channel region in the substrate 502 under the gate 536 of the first transistor 530, to advantageously increase an on-state current of the first transistor 530.

The integrated circuit 500 is placed in a two-step oxidized layer etch tool on a substrate base maintained at a temperature less than 40° C. A first step of a two-step process to remove the surface layer of oxidized silicon 506 is performed, for example as described in reference to FIG. 1A, in which a fluorine-containing gas, ammonia and an inert gas are provided to a remote plasma generator of the two-step oxidized layer etch tool. The remote plasma generator generates a plasma, producing fluorine radicals which flow through a heated element of the two-step oxidized layer etch tool and adsorb onto an existing top surface of the integrated circuit 500, including on the surface layer of oxidized silicon 506. The adsorbed fluorine radicals react with the surface layer of oxidized silicon 506 to produce silicon-fluorine by-products which remain on the surface layer of oxidized silicon 506.

Figure 5B:
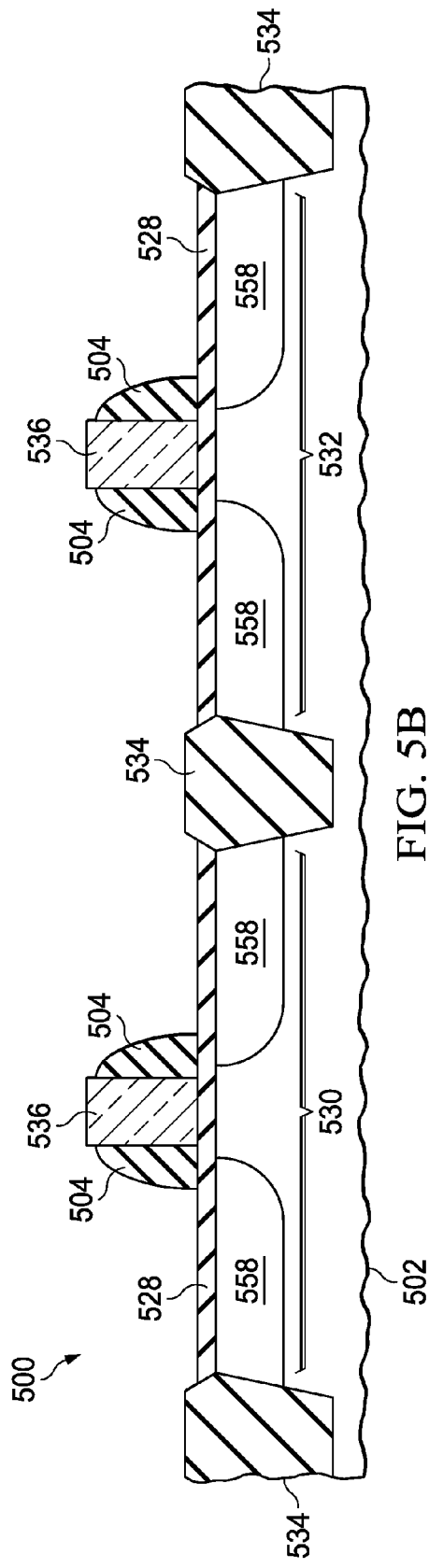

Referring to FIG. 5B, a second step of the two-step process is performed, for example as described in reference to FIG. 1B, in which the integrated circuit 500 is raised off the substrate base to a position proximate to the heated element. The silicon-fluorine by-products are heated by gas flowing through the heated element, causing the silicon-fluorine by-products to sublime and be removed. The gates 536 and the gate dielectric layer 528 in the first transistor 530 and the second transistor 532 are advantageously not significantly etched by the two-step process. The integrated circuit 500 is not exposed to an ambient containing more than 1 torr of oxygen between removal of the surface layer of oxidized silicon 506 and subsequent removal of at least a portion of the sidewall spacers 504.

Figure 5C:
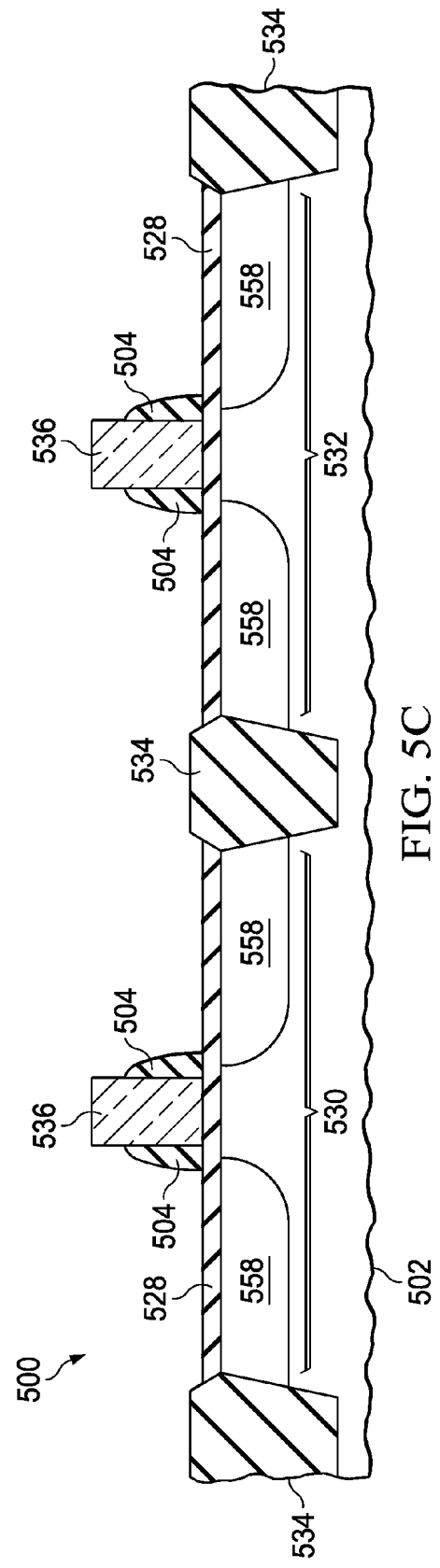

Referring to FIG. 5C, the integrated circuit 500 is lowered onto the substrate base. Fluorine-containing reagents, substantially free of ammonia, and an inert gas are provided to the remote plasma generator. A plasma is generated using the reagents and inert gas, producing fluorine radicals which flow through the heated element and onto an existing top surface of the integrated circuit 500, including on the sidewall spacers 504. The fluorine radicals react with silicon in the sidewall spacers 504 so as to remove a portion of the sidewall spacers 504. The gates 536 and the gate dielectric layer 528 in the first transistor 530 and the second transistor 532 are advantageously not removed by the fluorine radicals. In one version of the instant example, generation of the fluorine radicals may be ceased when a width of the sidewall spacers 504 is decreased to a desired value, as depicted in FIG. 5C.

Referring to FIG. 5D, the generation of the fluorine radicals may be continued until the sidewall spacers 504 of FIG. 5C are removed. Complete removal of the sidewall spacers 504 may advantageously transfer more stress from the permanent stress layer to the channel region. The gates 536 and the gate dielectric layer 528 in the first transistor 530 and the second transistor 532 are advantageously not removed by the fluorine radicals during complete removal of the sidewall spacers 504.

Referring to FIG. 5E, the permanent stress layer 562 is formed over an existing top surface of the integrated circuit 500, so as to conformally cover the gates 536 of the first transistor 530 and the second transistor 532. The permanent stress layer 562 has a stress greater than 100 MPa, either tensile or compressive, as needed to provide increased on-state current in the first transistor 530. The permanent stress layer 562 may be formed by a PECVD process.

Figure 5F:
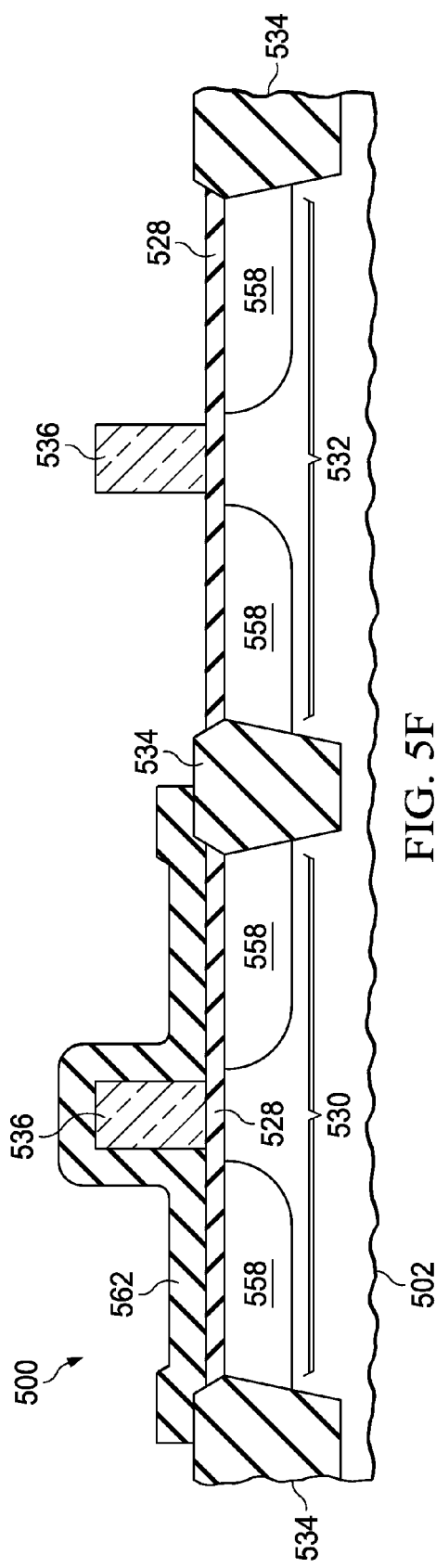

Referring to FIG. 5F, the permanent stress layer 562 may optionally be patterned so as to remove the permanent stress layer 562 from the second transistor 532 and leave the permanent stress layer 562 on the first transistor 530. The permanent stress layer 562 may be patterned by forming a mask over the permanent stress layer 562 so as to cover the first transistor 530 and expose the second transistor 532, and subsequently removing the permanent stress layer 562 from areas exposed by the mask. Optionally, a second permanent stress layer with a different stress value may be formed over the second transistor 532.

Figure 6A:
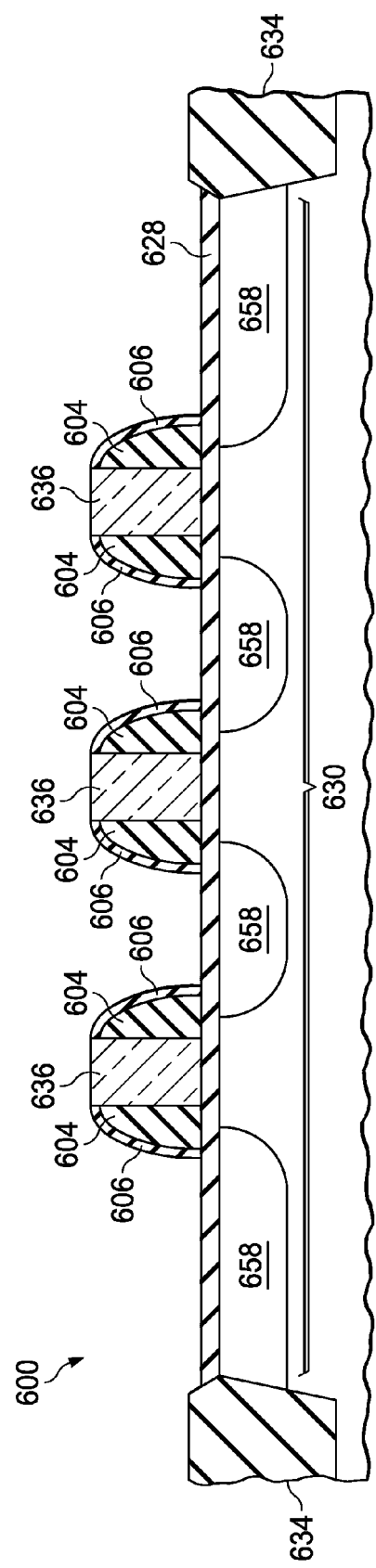
FIG. 6A through FIG. 6E are cross sections of an integrated circuit with sacrificial silicon nitride features during an example fabrication process, depicted in successive stages of formation.

FIG. 6A through FIG. 6E are cross sections of an integrated circuit with sacrificial silicon nitride features during an example fabrication process, depicted in successive stages of formation. Referring to FIG. 6A, the integrated circuit 600 is formed on a substrate 602, such as a silicon wafer. A gate dielectric layer 628 is formed at a top surface of the substrate 602 in an active area 630 bounded by field oxide 634. A plurality of gates 636 are formed adjacent to one another over the gate dielectric layer 628 so as to be closely spaced together, possibly at a minimum pitch used to design the integrated circuit 600. Sidewall spacers 604 are formed of silicon nitride on lateral surfaces of the gates 636, for example by forming a conformal layer of silicon nitride over an existing top surface of said integrated circuit and anisotropically etching the conformal layer of silicon nitride to leave the sidewall spacers 604. The sidewall spacers 604 are sacrificial silicon nitride features. A surface layer of oxidized silicon 606 is formed at exposed surfaces of the sidewall spacers 604 by exposure to oxidizing ambients during fabrication of the integrated circuit 600. Source/drain regions 658 are formed in the substrate 602 adjacent to the sidewall spacers 604 by implanting dopants into the substrate 602 while the sidewall spacers 604 are in place. An initial width of the sidewall spacers 604 is selected to provide a desired lateral separation between the source/drain regions 658 and the gates 636. It may be desirable to reduce the width of the sidewall spacers 604 to reduce formation of voids when filling spaces between the gates 636 with dielectric material during formation of a pre-metal dielectric (PMD) layer.

The integrated circuit 600 is placed in a two-step oxidized layer etch tool on a substrate base maintained at a temperature less than 40° C. A first step of a two-step process to remove the surface layer of oxidized silicon 606 is performed, for example as described in reference to FIG. 1A, in which a fluorine-containing gas, ammonia and an inert gas are provided to a remote plasma generator of the two-step oxidized layer etch tool. The remote plasma generator generates a plasma, producing fluorine radicals which flow through a heated element of the two-step oxidized layer etch tool and adsorb onto an existing top surface of the integrated circuit 600, including on the surface layer of oxidized silicon 606. The adsorbed fluorine radicals react with the surface layer of oxidized silicon 606 to produce silicon-fluorine by-products which remain on the surface layer of oxidized silicon 606.

Figure 6B:
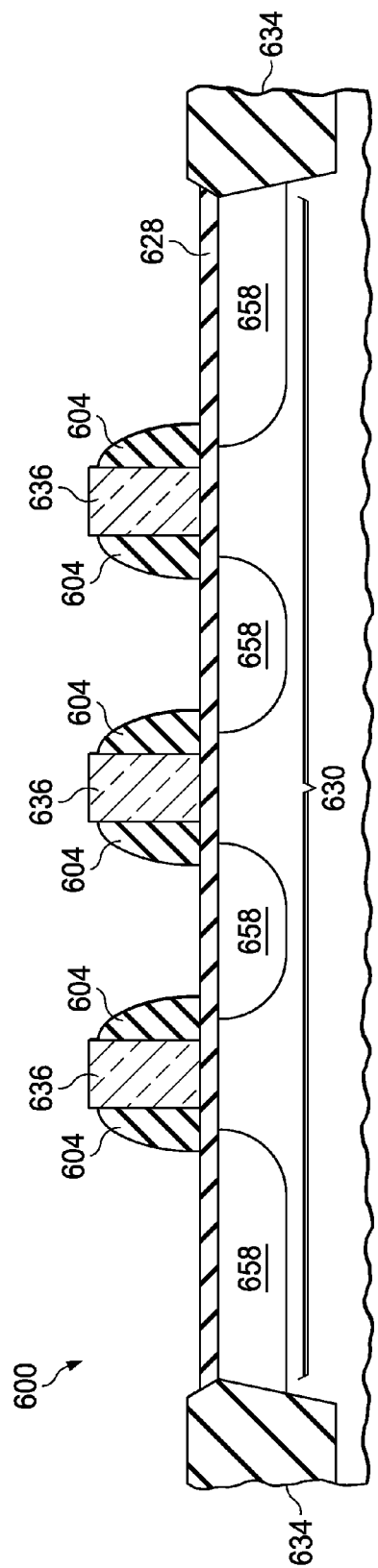

Referring to FIG. 6B, a second step of the two-step process is performed, for example as described in reference to FIG. 1B, in which the integrated circuit 600 is raised off the substrate base to a position proximate to the heated element. The silicon-fluorine by-products are heated by gas flowing through the heated element, causing the silicon-fluorine by-products to sublime and be removed. The gates 636 and the gate dielectric layer 628 in the active area 630 are advantageously not significantly etched by the two-step process. The integrated circuit 600 is not exposed to an ambient containing more than 1 torr of oxygen between removal of the surface layer of oxidized silicon 606 and subsequent removal of at least a portion of the sidewall spacers 604.

Figure 6C:
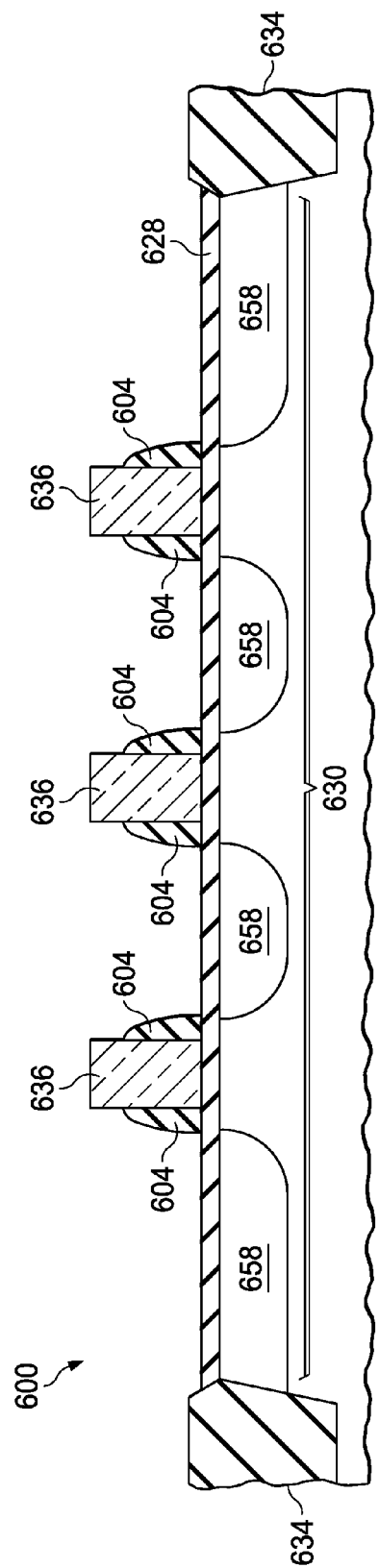

Referring to FIG. 6C, the integrated circuit 600 is lowered onto the substrate base. Fluorine-containing reagents, substantially free of ammonia, and an inert gas are provided to the remote plasma generator. A plasma is generated using the reagents and inert gas, producing fluorine radicals which flow through the heated element and onto an existing top surface of the integrated circuit 600, including on the sidewall spacers 604. The fluorine radicals react with silicon in the sidewall spacers 604 so as to remove a portion of the sidewall spacers 604. The gates 636 and the gate dielectric layer 628 in the active area 630 are advantageously not removed by the fluorine radicals. Generation of the fluorine radicals is ceased when a width of the sidewall spacers 604 is decreased to a desired value.

Figure 6D:
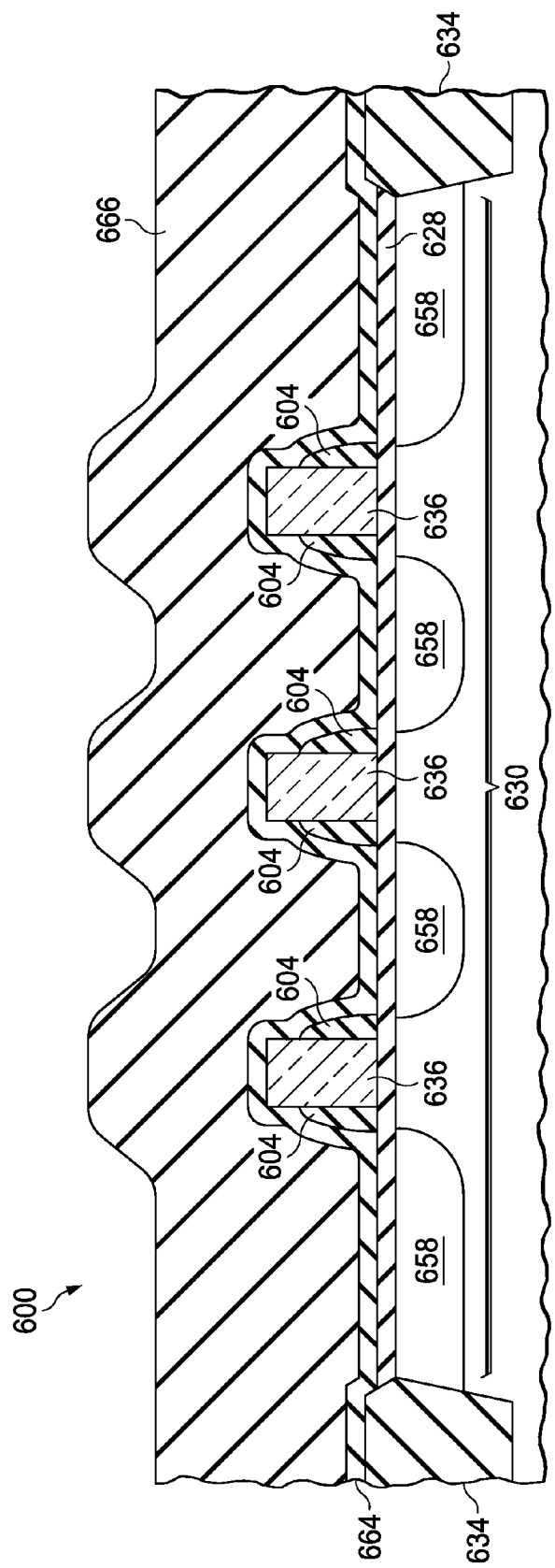

Referring to FIG. 6D, a PMD liner 664 is formed over an existing top surface of the integrated circuit 600. The PMD liner 664 may include, for example, one or more layers of silicon nitride and/or silicon dioxide. The PMD liner 664 is formed as a conformal layer by a PECVD process. A PMD layer 666 is formed over the PMD liner 664 so as to fill the spaces between the gates 636 with dielectric material. The PMD layer 666 may include, for example, one or more layers of silicon dioxide or boron-phosphorus silicate glass (BPSG), formed by a PECVD process. Reducing the width of the sidewall spacers 604 may advantageously reduce voids in the PMD layer 666 between the gates 636.

Figure 6E:
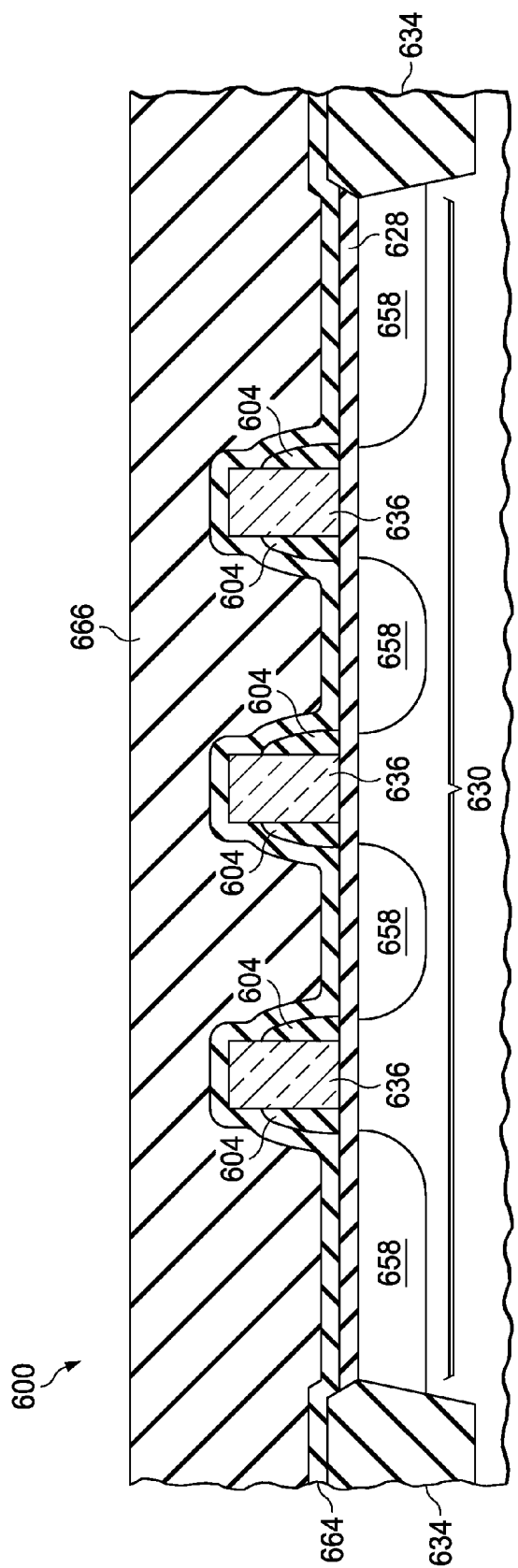

Referring to FIG. 6E, the PMD layer 666 may optionally be planarized to facilitate formation of contacts through the PMD layer 666 and the PMD liner 664, and formation of metal interconnects over the PMD layer 666. The PMD layer 666 may be planarized, for example, by a chemical mechanical polish (CMP) process or a resist etchback (REB) process. Reduction of voids in the PMD layer 666 between the gates 636 may advantageously reduce trapped contaminants from the CMP or REB process While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps:

forming a sacrificial silicon nitride feature on said integrated circuit;

forming a surface layer of oxidized silicon on an exposed surface of said sacrificial silicon nitride feature;

placing said integrated circuit in a two-step oxidized layer etch tool, so that a substrate of said integrated circuit is on a substrate base of said two-step oxidized layer etch tool, said substrate base being at a temperature less than 40° C.;

generating a plasma in said two-step oxidized layer etch tool using a fluorine-containing gas, ammonia and an inert gas so as to produce fluorine radicals which adsorb onto said surface layer of oxidized silicon and react with said surface layer of oxidized silicon while said substrate is on said substrate base;

raising said substrate off said substrate base proximate to a heated element of said two-step oxidized layer etch tool so that by-products of a reaction between said fluorine radicals and said surface layer of oxidized silicon are removed, said heated element being at a temperature above 90° C.;

subsequently lowering said substrate onto said substrate base; and generating a plasma in said two-step oxidized layer etch tool using fluorine-containing reagents which are substantially free of ammonia so as to produce fluorine radicals which react with silicon in said sacrificial silicon nitride feature so as to remove at least a portion of said sacrificial silicon nitride feature, so that said integrated circuit is not exposed to an ambient containing more than 1 torr of oxygen between said step of raising said substrate off said substrate base and the instant step.

2. The method of claim 1, in which said step of generating said plasma in said two-step oxidized layer etch tool using fluorine-containing reagents which are substantially free of ammonia is continued so as to remove said sacrificial silicon nitride feature.

3. The method of claim 1, in which said step of forming said sacrificial silicon nitride feature comprises the steps:

forming a layer of gate material over a gate dielectric layer of said integrated circuit;

forming a sacrificial silicon nitride layer over said layer of gate material;

forming a gate mask over said sacrificial silicon nitride layer;

removing silicon nitride from said sacrificial layer silicon nitride and removing gate material from said layer of gate material in areas exposed by said gate mask; and removing said gate mask.

4. The method of claim 1, in which said step of forming said sacrificial silicon nitride feature comprises the steps:

forming a sacrificial silicon nitride mask over a first transistor of said integrated circuit so as to expose a second transistor of said integrated circuit;

removing semiconductor material from a substrate of said integrated circuit adjacent to a gate of said second transistor to form source/drain cavities; and forming silicon-germanium source/drain regions of said second transistor in said form source/drain cavities by a selective epitaxial growth process, such that said sacrificial silicon nitride mask blocks epitaxial growth on said first transistor.

5. The method of claim 1, in which said step of forming said sacrificial silicon nitride feature comprises the steps:

implanting dopants into a transistor to form source/drain implanted regions in said substrate adjacent to a gate of said transistor and to form a gate implanted region is said gate, said gate being predominantly polycrystalline silicon, said gate implanted region being at least partly amorphized by said dopants;

forming a conformal layer of stressed silicon nitride over said transistor, said conformal layer of stressed silicon nitride having a stress greater than 100 megapascals (MPa); and heating said integrated circuit so as to activate said dopants in said source/drain implanted regions and to recrystallizes said gate implanted region.

6. The method of claim 1, in which said step of forming said sacrificial silicon nitride feature comprises the steps:

forming a conformal layer of silicon nitride over a transistor of said integrated circuit; and anisotropically etching said conformal layer of silicon nitride to leave sidewall spacers on lateral surfaces of a gate of said transistor;

and further including the step of forming a permanent stress layer over said transistor, after said step of generating said plasma in said two-step oxidized layer etch tool using fluorine-containing reagents which are substantially free of ammonia, said permanent stress layer having a stress greater than 100 MPa.

7. The method of claim 1, in which said step of forming said sacrificial silicon nitride feature comprises the steps:

forming a conformal layer of silicon nitride over a plurality of gates of said integrated circuit, said gates being adjacent to one another; and anisotropically etching said conformal layer of silicon nitride to leave sidewall spacers on lateral surfaces of said gates;

and further including the step of forming a pre-metal dielectric (PMD) layer over said gates, after said step of generating said plasma in said two-step oxidized layer etch tool using fluorine-containing reagents which are substantially free of ammonia.

8. The method of claim 1, in which said substrate base is at a temperature of 25° C. to 35° C.

9. The method of claim 1, in which said heated element is at a temperature of 110° C. to 120° C.

10. The method of claim 1, in which said fluorine-containing reagents in said step of generating said plasma in said two-step oxidized layer etch tool using fluorine-containing reagents which are substantially free of ammonia includes ammonium trifluoride.

11. The method of claim 1, in which said fluorine-containing reagents in said step of generating said plasma in said two-step oxidized layer etch tool using fluorine-containing reagents which are substantially free of ammonia includes sulfur hexafluoride.

12. A method of forming an integrated circuit, comprising the steps:

forming a conformal layer of silicon nitride over a first transistor of said integrated circuit;

anisotropically etching said conformal layer of silicon nitride to leave sidewall spacers on lateral surfaces of a gate of said first transistor;

forming a surface layer of oxidized silicon on exposed surfaces of said sidewall spacers;

placing said integrated circuit in a two-step oxidized layer etch tool, so that a substrate of said integrated circuit is on a substrate base of said two-step oxidized layer etch tool, said substrate base being at a temperature of 25° C. to 35° C.;

generating a plasma in said two-step oxidized layer etch tool using a fluorine-containing gas, ammonia and an inert gas so as to produce fluorine radicals which adsorb onto said surface layer of oxidized silicon and react with said surface layer of oxidized silicon while said substrate is on said substrate base;

raising said substrate off said substrate base proximate to a heated showerhead of said two-step oxidized layer etch tool so that by-products of a reaction between said fluorine radicals and said surface layer of oxidized silicon are removed, said heated element being at a temperature of 110° C. to 120° C.;

subsequently lowering said substrate onto said substrate base;

generating a plasma in said two-step oxidized layer etch tool using fluorine-containing reagents which are substantially free of ammonia so as to produce fluorine radicals which react with silicon in said sidewall spacers so as to remove at least a portion of said sidewall spacers, so that said integrated circuit is not exposed to an ambient containing more than 1 torr of oxygen between said step of raising said substrate off said substrate base and the instant step; and subsequently forming a permanent stress layer over said first transistor.

13. The method of claim 12, in which said step of generating said plasma in said two-step oxidized layer etch tool using fluorine-containing reagents which are substantially free of ammonia is continued so as to remove said sidewall spacers.

14. The method of claim 12, in which said fluorine-containing reagents in said step of generating said plasma in said two-step oxidized layer etch tool using fluorine-containing reagents which are substantially free of ammonia includes ammonium trifluoride.

15. The method of claim 12, in which said fluorine-containing reagents in said step of generating said plasma in said two-step oxidized layer etch tool using fluorine-containing reagents which are substantially free of ammonia includes sulfur hexafluoride.

16. The method of claim 12, further comprising the step of removing said permanent stress layer from a second transistor of said integrated circuit.

17. A method of forming an integrated circuit, comprising the steps:

forming a conformal layer of silicon nitride over a plurality of gates of said integrated circuit, said gates being adjacent to one another;

anisotropically etching said conformal layer of silicon nitride to leave sidewall spacers on lateral surfaces of said gates;

forming a surface layer of oxidized silicon on exposed surfaces of said sidewall spacers;

placing said integrated circuit in a two-step oxidized layer etch tool, so that a substrate of said integrated circuit is on a substrate base of said two-step oxidized layer etch tool, said substrate base being at a temperature of 25° C. to 35° C.;

generating a plasma in said two-step oxidized layer etch tool using a fluorine-containing gas, ammonia and an inert gas so as to produce fluorine radicals which adsorb onto said surface layer of oxidized silicon and react with said surface layer of oxidized silicon while said substrate is on said substrate base;

raising said substrate off said substrate base proximate to a heated showerhead of said two-step oxidized layer etch tool so that by-products of a reaction between said fluorine radicals and said surface layer of oxidized silicon are removed, said heated element being at a temperature of 110° C. to 120° C.;

subsequently lowering said substrate onto said substrate base;

generating a plasma in said two-step oxidized layer etch tool using fluorine-containing reagents which are substantially free of ammonia so as to produce fluorine radicals which react with silicon in said sidewall spacers so as to remove a portion of said sidewall spacers, so that said integrated circuit is not exposed to an ambient containing more than 1 torr of oxygen between said step of raising said substrate off said substrate base and the instant step; and subsequently forming a PMD layer over said plurality of said gates.

18. The method of claim 17, in which said fluorine-containing reagents in said step of generating said plasma in said two-step oxidized layer etch tool using fluorine-containing reagents which are substantially free of ammonia includes ammonium trifluoride.

19. The method of claim 17, in which said fluorine-containing reagents in said step of generating said plasma in said two-step oxidized layer etch tool using fluorine-containing reagents which are substantially free of ammonia includes sulfur hexafluoride.

20. The method of claim 17, further comprising the step of planarizing said PMD layer.

* * * * *